(12) United States Patent
Sato et al.

(10) Patent No.: US 11,841,177 B2
(45) Date of Patent: Dec. 12, 2023

(54) REFRIGERANT CONTROL SYSTEM AND COOLING SYSTEM

(71) Applicant: ATS Japan Co., Ltd., Tokyo (JP)

(72) Inventors: Toshimi Sato, Tokyo (JP); Kazushige Shimizu, Tokyo (JP); Yasuhiro Fukami, Tokyo (JP); Tomoyuki Kariya, Tokyo (JP)

(73) Assignee: ATS JAPAN CO., LTD., Tokyo (JP)

( * ) Notice: Subject to any disclaimer, the term of this patent is extended or adjusted under 35 U.S.C. 154(b) by 425 days.

(21) Appl. No.: 17/347,368

(22) Filed: Jun. 14, 2021

(65) Prior Publication Data
US 2021/0302087 A1 Sep. 30, 2021

Related U.S. Application Data

(63) Continuation-in-part of application No. PCT/JP2019/007047, filed on Feb. 25, 2019.

(51) Int. Cl.
*F25B 49/02* (2006.01)
*F25B 41/20* (2021.01)
(Continued)

(52) U.S. Cl.
CPC .............. *F25B 49/02* (2013.01); *F25B 9/008* (2013.01); *F25B 41/20* (2021.01); *F25B 45/00* (2013.01);
(Continued)

(58) Field of Classification Search
CPC .......... F25B 49/02; F25B 41/20; F25B 9/008; F25B 45/00; F25B 49/022; F25B 2600/05;
(Continued)

(56) References Cited

U.S. PATENT DOCUMENTS 4,840,042 A 6/1989 Ikoma et al.
4,961,323 A * 10/1990 Katsuna ............... B60H 1/3204
62/502
(Continued)

FOREIGN PATENT DOCUMENTS

CN 102022853 A 4/2011
CN 104132486 A 11/2014
(Continued)

*Primary Examiner* — Jon T. Schermerhorn, Jr.
(74) *Attorney, Agent, or Firm* — Reinhart Boerner Van Deuren P.C.

(57) ABSTRACT

A refrigerant control system for controlling a first refrigerant flowing through a first circulation passage connected to a compression unit, including a storing unit which stores a first refrigerant, a first sub-pipe which is connected to an outlet side pipe, a second sub-pipe which is connected to an inlet side pipe, a first opening/closing valve which is provided in the first sub-pipe and is capable of switching whether to flow the first refrigerant in the outlet side pipe to the storing unit, a second opening/closing valve which is provided in the second sub-pipe and is capable of switching whether to flow the first refrigerant in the storing unit to the inlet side pipe, and an opening/closing control unit which controls an opening/closing state of the first opening/closing valve and the second opening/closing valve on the basis of a setting temperature of a second refrigerant set according to a predetermined method.

11 Claims, 11 Drawing Sheets

(51) Int. Cl.
*F25B 9/00* (2006.01)
*F25B 45/00* (2006.01)
*H01L 21/67* (2006.01)

(52) U.S. Cl.
CPC ...... *H01L 21/67017* (2013.01); *F25B 49/022* (2013.01); *F25B 2600/05* (2013.01); *F25B 2600/2507* (2013.01); *F25B 2700/2117* (2013.01)

(58) Field of Classification Search
CPC ..... F25B 2600/2507; F25B 2700/2117; H01L 21/67017
See application file for complete search history.

(56) References Cited

U.S. PATENT DOCUMENTS

| | | | | |
|---|---|---|---|---|
| 6,467,304 | B2* | 10/2002 | Matsumura | C09K 5/041 62/502 |
| 6,516,629 | B2* | 2/2003 | Matsumura | C09K 5/041 62/502 |
| 8,424,326 | B2* | 4/2013 | Mitra | F25B 1/10 62/509 |
| 10,845,129 | B2* | 11/2020 | Sakai | F24T 10/20 |
| 11,768,020 | B2* | 9/2023 | Knight | F25B 41/20 62/216 |
| 2011/0041523 | A1 | 2/2011 | Taras et al. | |
| 2019/0193517 | A1* | 6/2019 | Kobayashi | B60H 1/00835 |

FOREIGN PATENT DOCUMENTS

| | | |
|---|---|---|
| CN | 109114718 A | 1/2019 |
| DE | 10124227 A1 | 12/2002 |
| EP | 2995885 A1 | 3/2016 |
| EP | 3239624 A1 | 11/2017 |
| JP | 5051250 A | 5/1975 |
| JP | 60264 A | 1/1985 |
| JP | 6438567 A | 2/1989 |
| JP | 6438568 A | 2/1989 |
| JP | 1137579 A | 2/1999 |
| JP | H1163686 A | 3/1999 |
| JP | 2000146328 A | 5/2000 |
| JP | 2000266415 A | 9/2000 |
| JP | 2001-141316 A | 5/2001 |
| JP | 2002195705 A | 7/2002 |
| JP | 2014119145 A | 6/2014 |
| KR | 970059656 A | 8/1997 |
| WO | 2011/064813 A1 | 6/2011 |
| WO | WO 2014/092152 A1 | 6/2014 |
| WO | WO 2014/181399 A1 | 11/2014 |

* cited by examiner

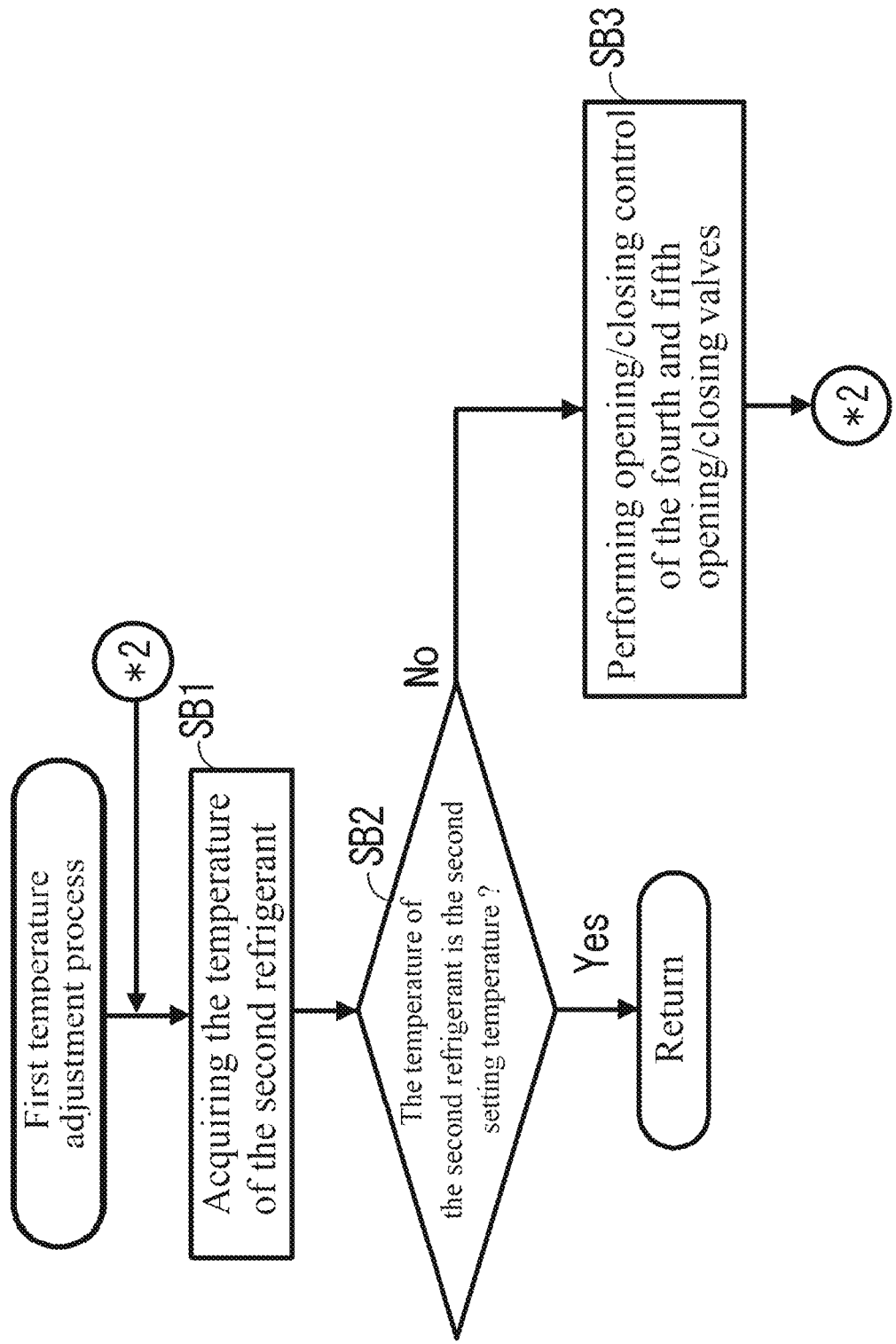

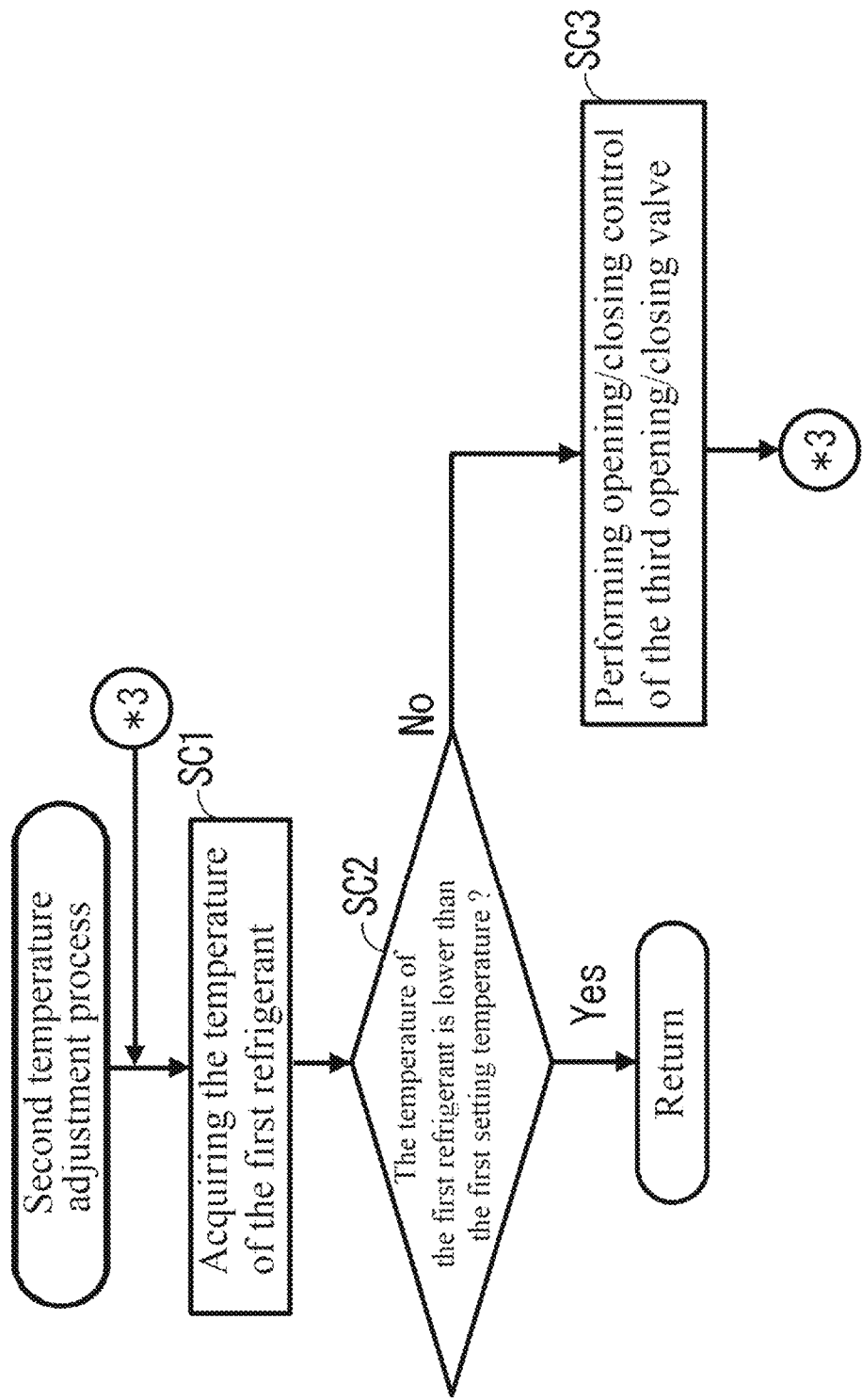

REFRIGERANT CONTROL SYSTEM AND COOLING SYSTEM

The present application is a continuation-in-part application of PCT application No. PCT/JP2019/007047 filed on Feb. 25, 2019, the disclosure of which is incorporated by reference its entirety.

INCORPORATION BY REFERENCE

All publications and patent applications mentioned in this specification are herein incorporated by reference in their entirely to the same extent as if each individual publication or patent application was specifically and individually indicated to be incorporated by reference.

TECHNICAL FIELD

The present invention relates to a refrigerant control system and a cooling system.

BACKGROUND

Conventionally, a device for cooling a cooling target has been proposed. For example, a device of Patent Document 1 includes a high source refrigeration cycle connecting a high source side compressor, a high source side condenser, a high source side throttling device, and a high source side evaporator by a pipe and circulating a refrigerant, a low source refrigeration cycle connecting a low source side compressor, an auxiliary radiator, a low source side condenser, a low source side throttling device, and a low source side evaporator by a pipe and circulating a refrigerant, and a cascade capacitor obtained by coupling the high source side evaporator and the low source side condenser so as to exchange heat between the refrigerants respectively passing through them. Further, since an intake side pipe of the low source side compressor in the pipe of the low source refrigeration cycle is connected to an expansion tank through an electromagnetic valve, a pressure in the low source refrigeration cycle can be adjusted so as not to be equal to or higher than a setting pressure by opening the electromagnetic valve so that the refrigerant in the low source refrigeration cycle flows into the expansion tank. With such a configuration, it is possible to exchange heat between the cooling target disposed in the vicinity of the low source side evaporator of the low source refrigeration cycle and the refrigerant in the low source refrigeration cycle and to cool the cooling target.

CITATION LIST

Patent Document

Patent Document 1: International Publication WO2014/181399

SUMMARY OF THE INVENTION

Technical Problem

However, in the device of Patent Document 1, since the expansion tank is connected to the intake side pipe of the low source side compressor as described above, the pressure (the refrigerant amount) in the low source refrigeration cycle cannot be efficiently adjusted, for example, when the temperature range of the cooling target is wide and hence the refrigerant amount necessary in the low source refrigeration cycle largely changes. Regarding the flow of the refrigerant in the intake side pipe of the low source side compressor and the expansion tank, the refrigerant in the intake side pipe of the low source side compressor only flows to the expansion tank as described above. For this reason, for example, when the refrigerant that easily becomes saturated vapor at a room temperature, an installation environment temperature, or the like is used in the intake side pipe of the low source side compressor, saturated vapor or condensate accumulates in the expansion tank. As a result, there is concern that the function of the low source refrigeration cycle may deteriorate. From the description above, there is room for improvement from the viewpoint of usability of the device.

It is an object of the present invention to solve the problems of the above mentioned prior arts.

Means for Solving the Problems

One aspect of the present invention provides a refrigerant control system for controlling a refrigerant flowing through a circulation passage connected to a compression section and circulating the refrigerant so as to exchange heat between a cooling target and the refrigerant compressed by the compression section, comprising: a storing section which stores the refrigerant; a first pipe which is connected to an outlet side pipe constituting the circulation passage and located on the side of an outlet of the compression section and flows the refrigerant in the outlet side pipe to the storing section through the first pipe; a second pipe which is connected to an inlet side pipe constituting the circulation passage and located on the side of an inlet of the compression section and flows the refrigerant in the storing section to the inlet side pipe through the second pipe; a first opening/closing valve which is provided in the first pipe and is capable of switching whether to flow the refrigerant in the outlet side pipe to the storing section; a second opening/closing valve which is provided in the second pipe and is capable of switching whether to now the refrigerant in the storing section to the inlet side pipe; and an opening/closing control section which controls an opening/closing state of the first opening/closing valve and the second opening/closing valve on the basis of a setting temperature of the cooling target set according to a predetermined method.

BRIEF DESCRIPTION OF THE DRAWINGS

FIG. 4A is a diagram illustrating a state in which the first opening/closing valve is opened and the second opening/closing valve is closed and FIG. 4B is a diagram illustrating a state in which the first opening/closing valve is closed and the second opening/closing valve is opened.

FIG. 5 is a flowchart of a first temperature adjustment process.

FIG. 6 is a flowchart of a second temperature adjustment process.

MODE FOR CARRYING OUT THE INVENTION

Hereinafter, an embodiment of a refrigerant control system and a cooling system according to the invention will be described in detail with reference to the accompanying drawings. First, one aspect of a concept of the embodiment will be described in [I], detailed contents of the embodiment will be described in [II], and finally modified examples of the embodiment will be described in [III]. Here, the invention is not limited to the embodiment.

[I] One Aspect of Concept of Embodiment

First, one aspect of a concept of the embodiment will be described. The embodiment schematically relates to a refrigerant control system which controls a refrigerant flowing through a circulation passage for circulating the refrigerant so that the refrigerant compressed by a compression section can exchange heat with a cooling target and to a cooling system. Here, the "refrigerant" means a medium used for cooling a cooling target and is a concept including, for example, a gaseous refrigerant (for example, carbon dioxide, chlorofluorocarbon, air, or the like), a liquid refrigerant (for example, water or the like), but in the embodiment, the refrigerant will be described as carbon dioxide. Further, the "cooling target" means a target to be cooled and is a concept including, for example, a device itself (or a system itself), a cooling refrigerant (as an example, a gaseous or liquid cooling refrigerant) of the device (or the system), and the like, but in the embodiment, the refrigerant will be described as a cooling refrigerant (specifically, a liquid cooling refrigerant) of a semiconductor fabrication system.

[II] Detailed Contents of Embodiment

Next, detailed contents of the embodiment will be described,
(Configuration)

Figure 1:
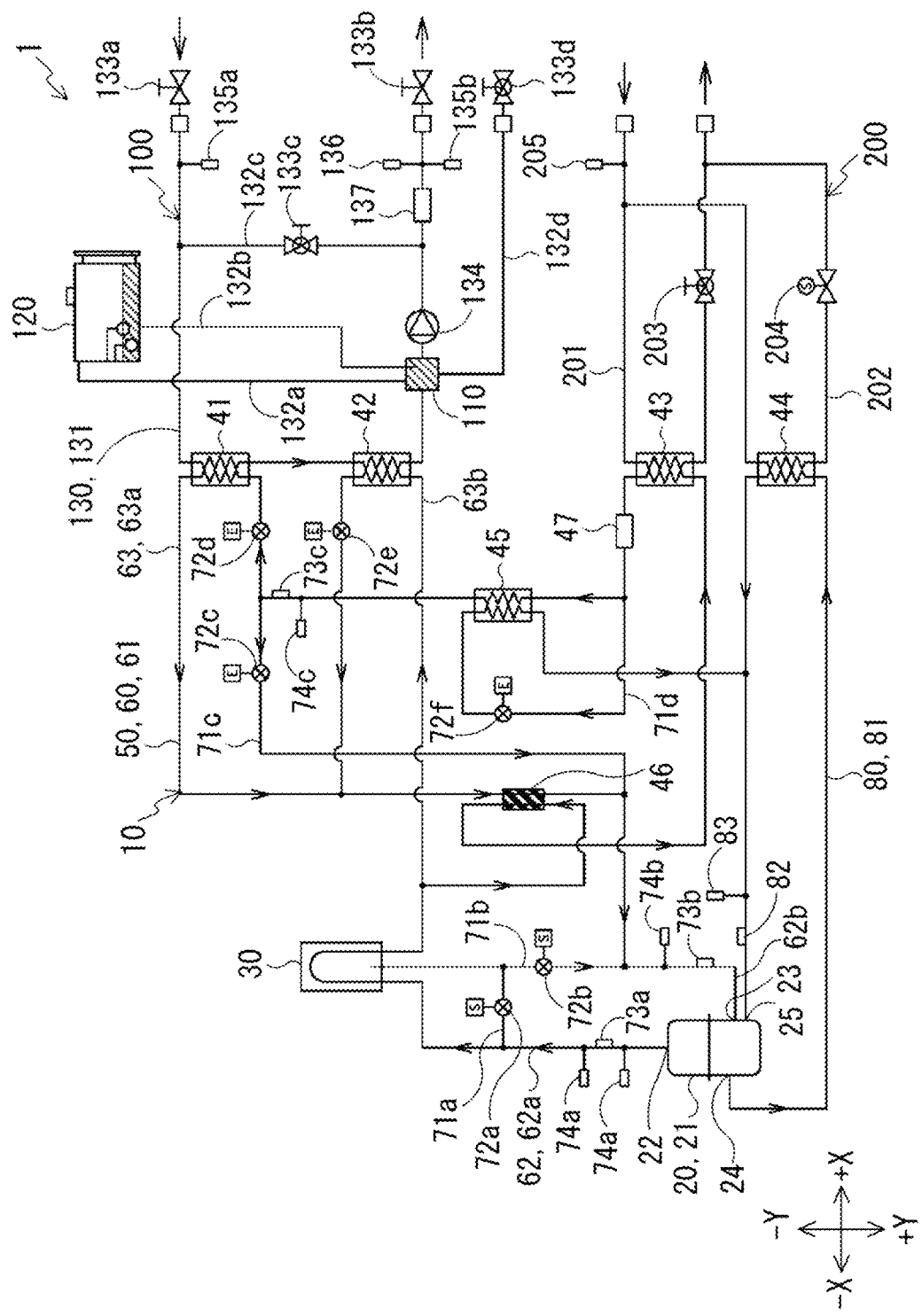
FIG. 1 is an outline diagram illustrating a cooling system according to an embodiment of the invention.

First, a configuration of a cooling system according to the embodiment will be described. FIG. 1 is an outline diagram illustrating a cooling system according to the embodiment of the invention. Furthermore, in the description below, the X direction of FIG. 1 will be referred to as the left and right direction of the cooling system (the +X direction will be referred to as the left direction of the cooling system and the −X direction will be referred to as the right direction of the cooling system), the Y direction of FIG. 1 will be referred to as the front and rear direction of the cooling system (the +Y direction will be referred to as the front direction of the cooling system and the −Y direction will be referred to as the rear direction of the cooling system), and the direction orthogonal to the X direction and the Y direction will be referred to as the up and down direction (the direction reaching the front side of FIG. 1 will be referred to as the up direction of the cooling system and the direction reaching the rear side of FIG. 1 will be referred to as the down direction of the cooling system).

The cooling system 1 is a system for cooling a second refrigerant by using a first refrigerant and includes a first cooling system 10, a second cooling system 100, a third cooling system 200, and a control device 300 of FIG. 2 to be described later as illustrated in FIG. 1. Here, the "first refrigerant" is used to cool the second refrigerant and is circulated by a circulation unit 50 to be described later. Further, the "second refrigerant" is cooled by the first refrigerant and is delivered by a delivery passage 131 of the second cooling system 100 to be described later. Furthermore, the first refrigerant corresponds to the "refrigerant" of claims and the second refrigerant corresponds to the "cooling target" of claims.

(Configuration—First Cooling System)

The first cooling system 10 is a system for exchanging heat between the first refrigerant and each of the second refrigerant and the third refrigerant and includes a compression unit 20, a storing unit 30, first to sixth heat exchanging units 41 to 46, a removal unit 47, and a circulation unit 50 as illustrated in FIG. 1. Here, the "third refrigerant" is used to cool the first refrigerant and is delivered by a first delivery passage 201 or a second delivery passage 202 of the third cooling system 200 to be described later. For example, the third refrigerant is a concept including a gaseous refrigerant, a liquid refrigerant, or the like, but in the embodiment, the third refrigerant will be described as industrial water.

(Configuration—First Cooling System—Compression Unit)

The compression unit 20 is a compression section for compressing the first refrigerant. The compression unit 20 is configured by using, for example, a known compressor (as an example, a frequency-controlled operation type double-stage compressor such as a compressor having an inverter drive circuit) or the like and specifically includes a compression unit body 21, a first outlet 22, a first inlet 23, a second outlet 24, and a second inlet 25.

Among these, the compression unit body 21 is a basic structure of the compression unit 20 and is hollow. Further, the first outlet 22 is an opening through which the first refrigerant in the compression unit body 21 flows to a first circulation passage 61 to be described later. Further, the first inlet 23 is an opening through which the first refrigerant in the first circulation passage 61 to be described later flows to the compression unit body 21. Further, the second outlet 24 is an opening through which the first refrigerant in the compression unit body 21 flows to a second circulation passage 81 to be described later. Further, the second inlet 25 is an opening through which the first refrigerant in the second circulation passage 81 to be described later flows to the compression unit body 21.

Further, the detailed operation contents of the compression unit 20 are arbitrary, but are as follows in the embodiment. That is, first, the first refrigerant flowing from the first circulation passage 61 to be described later to the compression unit body 21 through the first inlet 23 is compressed and the compressed first refrigerant flows to the second circulation passage 81 to be described later through the second outlet 24 (hereinafter, referred to as a "first compression operation"). Next, the first refrigerant flowing from the second circulation passage 81 to be described later to the compression unit body 21 through the second inlet 25 is compressed and the compressed first refrigerant flows to the first circulation passage 61 to be described later through the first outlet 22 (hereinafter, referred to as a "second compression operation"). Then, an operation cycle including the first compression operation and the second compression operation is repeated. With such an operation, the first refrigerant compressed twice by the compression unit 20 can flow to the first circulation passage 61 to be described later and hence the first refrigerant can be efficiently compressed as compared with a case in which the compression operation is performed only once.

(Configuration—First Cooling System—Storing Unit)

The storing unit 30 is a storing section for storing the first refrigerant. The storing unit 30 is configured by using, for example, a known refrigerant storing container (as an example, a hollow cylindrical expansion tank having an inlet and an outlet (not illustrated) through which the first refrigerant flows) and is installed on the side of the second cooling system 100 in relation to the compression unit 20 as illustrated in FIG. 1.

Further, the detailed size (for example, diameter and height) of the storing unit 30 is arbitrary, but may be set on the basis of an experiment result or the like in that the size is desirably as small as possible, for example, if a desired amount of the first refrigerant can be stored.

(Configuration—First Cooling System—Heat Exchanging Unit)

The first heat exchanging unit 41 is used to exchange heat between the first refrigerant and the second refrigerant in the first circulation passage 61 to be described later and is a first heat exchanging section capable of cooling the second refrigerant. The first heat exchanging unit 41 is configured by using, for example, a known heat exchanger (as an example, an evaporator) or the like and is installed at a position in the vicinity of the second cooling system 100 (in FIG. 1, an upstream position of the delivery passage 131 to be described later) as illustrated in FIG. 1.

The second heat exchanging unit 42 is used to exchange heat between the first refrigerant and the second refrigerant in the first circulation passage 61 to be described later and is a second heat exchanging section capable of heating the second refrigerant cooled by the first heat exchanging unit 41. The second heat exchanging unit 42 is configured by using, for example, a known heat exchanger (as an example, a plate heat exchanger) or the like and is installed at a position in the vicinity of the second cooling system 100 (in FIG. 1, a downstream position of the delivery passage 131 to be described later) as illustrated in FIG. 1. The second refrigerant cooled by the first heat exchanging unit 41 can be heated by the second heat exchanging unit 42 and the temperature of the downstream portion of the delivery passage 131 to be described later can be easily maintained at a predetermined temperature. Furthermore, the "first heat exchanging unit 41" and the "second heat exchanging unit 42" described above correspond to the "heat exchanging section" of claims.

The third heat exchanging unit 43 is used to exchange heat between the first refrigerant and the third refrigerant in the first circulation passage 61 to be described later and is a third heat exchanging section capable of cooling the first refrigerant. The third heat exchanging unit 43 is configured by using, for example, a known heat exchanger or the like and is installed at a position in the vicinity of the third cooling system 200 as illustrated in FIG. 1.

The fourth heat exchanging unit 44 is used to exchange heat between the first refrigerant and the third refrigerant in the second circulation passage 81 to be described later and is a fourth heat exchanging section capable of cooling the first refrigerant. The fourth heat exchanging unit 44 is configured by using, for example, a known heat exchanger or the like and is installed at a position in the vicinity of the third cooling system 2100 (in FIG. 1, a position different from the third heat exchanging unit 43) as illustrated in FIG. 1.

The fifth heat exchanging unit 45 is used to exchange heat between the first refrigerant in an upstream position in relation to the first heat exchanging unit 41 in a first cooling target side pipe 63*a* to be described later and the first refrigerant in a fourth sub-pipe 71*d* to be described later and is a fifth heat exchanging section capable of cooling the first refrigerant in the first cooling target side pipe 63*a* to be described later. The fifth heat exchanging unit 45 is configured by using, for example, a known heat exchanger or the like and is installed between the second heat exchanging unit 42 and the third heat exchanging unit 43 as illustrated in FIG. 1. The first refrigerant in an upstream portion in relation to the first heat exchanging unit 41 in the first cooling target side pipe 63*a* to be described later can be cooled (supercooled) by the fifth heat exchanging unit 45 as compared with a case in which the fifth heat exchanging unit 45 is not provided and the cooling efficiency of the cooling system 1 can be improved while promoting the cooling of the second refrigerant.

The sixth heat exchanging unit 46 is used to exchange heat between the first refrigerant in an upstream portion in relation to the first heat exchanging unit 41 in the first cooling target side pipe 63*a* to be described later and the first refrigerant in a downstream portion in relation to the second heat exchanging unit 42 in the second cooling target side pipe 63*b* to be described later and is a refrigerant heat exchanging section capable of heating the first refrigerant in the second cooling target side pipe 63*b* to be described later. The sixth heat exchanging unit 46 is configured by using, for example, a known heat exchanger or the like and is installed between the storing unit 30 and the first heat exchanging unit 41 (or the second heat exchanging unit 42) as illustrated in FIG. 1. The temperature of the first refrigerant in a downstream portion in relation to the second heat exchanging unit 42 in the second cooling target side pipe 63*b* to be described later can be increased by the sixth heat exchanging unit 46 and the dried first refrigerant can flow into the compression unit 20.

(Configuration—First Cooling System—Removal Unit)

The removal unit 47 is a removal section for removing foreign matter (for example, dirt, dust, or the like) or moisture contained in the first refrigerant in the first circulation passage 61 to be described later. The removal unit 47 is configured by using, for example, a known refrigerant remover (for example, a filter dryer) or the like and is installed between the third heat exchanging unit 43 and the fifth heat exchanging unit 45 as illustrated in FIG. 1.

(Configuration—First Cooling System—Circulation Unit)

The circulation unit 50 is a circulation section for circulating the first refrigerant and includes a first circulation unit 60 and a second circulation unit 80 as illustrated in FIG. 1.

(Configuration—First Cooling System—Circulation Unit—First Circulation Unit)

The first circulation unit 60 is used to circulate the first refrigerant toward the second cooling system 100 and includes the first circulation passage 61, first to fourth sub-pipes 71*a* to 71*d*, first to sixth opening/closing valves 72*a* to 72*f*, first to third temperature detecting units 73*a* to 73*c*, and first to third pressure detecting units 74*a* to 74*c* as illustrated in FIG. 1.

(Configuration—First Cooling System—Circulation Unit—First Circulation Unit—First Circulation Passage)

The first circulation passage 61 is a passage for circulating the first refrigerant so as to exchange heat between the first refrigerant and the second refrigerant compressed by the compression unit 20. The first circulation passage 61 is configured by using, for example, a known hermetic circulation passage and is installed so as to pass through the compression unit 20, the storing unit 30, the first to sixth heat exchanging units 41 to 46, and the removal unit 47 as illustrated in FIG. 1. Further, as illustrated in FIG. 1, this first circulation passage 61 includes the compression unit side pipe 62 and the cooling target side pipe 63.

(Configuration—First Cooling System—Circulation Unit—First Circulation Unit—First Circulation Passage—Compression Unit Side Pipe)

The compression unit side pipe 62 is a pipe located on the side of the compression unit 20 in the pipe constituting the first circulation passage 61. The compression unit side pipe 62 is configured by using, for example, a known refrigerant pipe or the like (furthermore, the same applies to the configurations of the other pipes) and includes an outlet side pipe 62*a* and an inlet side pipe 62*b* as illustrated in FIG. 1.

Among these, the outlet side pipe 62*a* is a pipe located on the side of the first outlet 22 of the compression unit 20 and is connected to the first outlet 22 of the compression unit 20 and the upstream end portion of the cooling target side pipe 63. Specifically, as illustrated in FIG. 1, the outlet side pipe is connected so that a part of the outlet side pipe 62*a* is accommodated in the storing unit 30. Further, the inlet side pipe 62*b* is a pipe located on the side of the first inlet 23 of the compression unit 20 and is connected to the first inlet 23 of the compression unit 20 and the downstream end portion of the cooling target side pipe 63 as illustrated in FIG. 1.

(Configuration—First Cooling System—Circulation Unit—First Circulation Unit—First Circulation Passage—Cooling Target Side Pipe)

The cooling target side pipe 63 is a pipe located on the side of the second cooling system 100 (the cooling target side) in the pipe constituting the first circulation passage 61 and includes the first cooling target side pipe 63*a* and the second cooling target side pipe 63*b* as illustrated in FIG. 1.

Among these, the first cooling target side pipe 63*a* is a pipe located on the side of the first heat exchanging unit 41 and is connected to the downstream end portion of the outlet side pipe 62*a* and the downstream end portion of the inlet side pipe 62*b*. Specifically, as illustrated in FIG. 1, the first cooling target side pipe is connected so as to sequentially pass through the sixth heat exchanging unit 46, the third heat exchanging unit 43, the removal unit 47, the fifth heat exchanging unit 45, the first heat exchanging unit 41, and the sixth heat exchanging unit 46. Further, the second cooling target side pipe 63*b* is a pipe located on the side of the second heat exchanging unit 42 and is connected to the downstream end portion of the outlet side pipe 62*a* and the downstream end portion of the inlet side pipe 62*b*. Specifically, as illustrated in FIG. 1, the second cooling target side pipe is connected so as to sequentially pass through the second heat exchanging unit 42 and the sixth heat exchanging unit 46. Furthermore, in the embodiment, as illustrated in FIG. 1, the downstream portion of the second cooling target side pipe 63*b* (specifically, a portion from the downstream end portion of the second cooling target side pipe 63*b* to the upstream side of the sixth heat exchanging unit 46) is integrally formed with the downstream portion of the first cooling target side pipe 63*a* so as to serve as the downstream portion of the first cooling target side pipe 63*a*.

The flow of the first refrigerant in the first circulation passage 61 is as follows. That is, first, a part of the first refrigerant compressed by the compression unit 20 flows to the first cooling target side pipe 63*a* through the outlet side pipe 62*a*. Next, the first refrigerant flowing to the first cooling target side pipe 63*a* is cooled by the third heat exchanging unit 43 and the fifth heat exchanging unit 45 and exchanges heat with the second refrigerant by the first heat exchanging unit 41 (specifically, heat exchange is performed to cool the second refrigerant). Subsequently, the first refrigerant exchanging heat with the second refrigerant is heated by the sixth heat exchanging unit 46 and flows to the compression unit 20 through the first cooling target side pipe 63*a* and the inlet side pipe 62*b*. Further, the other part of the first refrigerant compressed by the compression unit 20 flows to the second cooling target side pipe 63*b* through the outlet side pipe 62*a*. Next, the first refrigerant flowing to the second cooling target side pipe 63*b* exchanges heat with the second refrigerant by the second heat exchanging unit 42 (specifically, heat exchange is performed to heat the second refrigerant). Subsequently, the First refrigerant exchanging heat with the second refrigerant is heated by the sixth heat exchanging unit 46 and flows to the compression unit 20 through the second cooling target side pipe 63*b* and the inlet side pipe 62*b*.

The first refrigerant can be circulated by the first circulation passage 61 so as to exchange heat between the first refrigerant in the first circulation passage 61 and the second refrigerant in the delivery passage 131 to be described later.

(Configuration—First Cooling System—Circulation Unit—First Circulation Unit—Sub-Pipe)

The first sub-pipe 71*a* is a first pipe which allows the first refrigerant in the outlet side pipe 62*a* to flow into the storing unit 30 through the first sub-pipe 71*a*. The first sub-pipe 71*a* is connected to the outlet side pipe 62*a*. Specifically, as illustrated in FIG. 1, the upstream end portion of the first sub-pipe 71*a* is connected to an upstream portion in relation to the storing unit 30 in the outlet side pipe 62*a* and the downstream end portion of the first sub-pipe 71*a* is accommodated in the storing unit 30. The first refrigerant in the outlet side pipe 62*a* can flow to the storing unit 30 by the first sub-pipe 71*a* and an excessive pressure in the first circulation passage 61 can be prevented. Particularly, since the first sub-pipe 71*a* is connected to the outlet side pipe 62*a*, it is possible to effectively prevent an excessive pressure in the first circulation passage 61 as compared with a case in which the first sub-pipe 71*a* is connected to the inlet side pipe 62*b*. Further, since the temperature in the storing unit 30 can be easily maintained at a threshold temperature or more (for example, 31° C. or more or the like) of the first refrigerant due to the heat of the first refrigerant flowing to the storing unit 30, it is possible to suppress a decrease in the amount of the refrigerant in the first circulation passage 61 due to the condensation of the first refrigerant in the storing unit 30.

The second sub-pipe 71*b* is a second pipe which allows the first refrigerant in the storing unit 30 to flow into the inlet side pipe 62*b* through the second sub-pipe 71*b*. The second sub-pipe 71*b* is connected to the inlet side pipe 62*b*. Specifically, as illustrated in FIG. 1, the upstream end portion of the second sub-pipe 71*b* is connected to an upstream portion in relation to the compression unit 20 in the inlet side pipe 62*b* and the downstream end portion of the second sub-pipe 71*b* is accommodated in the storing unit 30. Furthermore, in the embodiment, as illustrated in FIG. 1, a portion on the side of the storing unit 30 in the second sub-pipe 71*b* is integrally formed with a portion on the side of the storing unit 30 in the first sub-pipe 71*a* so as to serve as a portion on the side of the storing unit 30 in the first sub-pipe 71*a*, but the invention is not limited thereto. For example, the portion may be formed separately from a portion on the side of the storing unit 30 in the first sub-pipe 71*a*. Since the first refrigerant (the extra first refrigerant) in the storing unit 30 can flow into the inlet side pipe 62*b* by the second sub-pipe 71*b* and the temperature in the inlet side pipe 62*b* can be increased by the heat of the flowing first refrigerant, it is possible to suppress the deterioration of the function or failure of the compression unit 20 due to the saturated steam flowing to the compression unit 20.

The third sub-pipe 71c is a third pipe which allows the first refrigerant in the first cooling target side pipe 63a to flow into the inlet side pipe 62b and is connected to the first cooling target side pipe 63a and the inlet side pipe 62b. Specifically, as illustrated in FIG. 1, the third sub-pipe is connected to an upstream portion in relation to the first heat exchanging unit 41 in the first cooling target side pipe 63a and the upstream end portion of the inlet side pipe 62b. The first refrigerant in an upstream portion in relation to the first heat exchanging unit 41 in the first cooling target side pipe 63a can flow to the inlet side pipe 62b by the third sub-pipe 71c and the temperature of the first refrigerant in the first circulation passage 61 can be adjusted by using the heat of the flowing first refrigerant.

The fourth sub-pipe 71d is a fourth pipe located on the side of the fifth heat exchanging unit 45 and is connected to a portion between the fifth heat exchanging unit 45 and the removal unit 47 in the second cooling target side pipe 63b and the downstream end portion of the second circulation passage 81 to be described later as illustrated in FIG. 1. Specifically, the fourth sub-pipe is connected so as to pass through the filth heat exchanging unit 45. It is possible to exchange heat between the first refrigerant in the fourth sub-pipe 71d and the first refrigerant in the first cooling target side pipe 63a by the fourth sub-pipe 71d.

(Configuration—First Cooling System—Circulation Unit—First Circulation Unit—Opening/Closing Valve)

The first opening/closing valve 72a is a valve capable of switching whether to flow the first refrigerant in the outlet side pipe 62a to the storing unit 30. The first opening/closing valve 72a is configured by using, for example, a known electromagnetic valve or the like (furthermore, the same applies to the configurations of the other opening/closing valves) and is provided in the first sub-pipe 71a. Specifically, as illustrated in FIG. 1, the first opening/closing valve is connected to a portion on the side of the compression unit 20 in the first sub-pipe 71a.

The second opening/closing valve 72b is a valve capable of flowing the first refrigerant in the storing unit 30 to the inlet side pipe 62b and is provided in the second sub-pipe 71b. Specifically, as illustrated in FIG. 1, the second opening/closing valve is provided in a portion on the side of the compression unit 20 in the second sub-pipe 71b.

The third opening/closing valve 72c is a valve capable of adjusting the amount of the first refrigerant existing in the cooling target side pipe 63 and flowing to the inlet side pipe 62b and is provided in the third sub-pipe 71c. Specifically, as illustrated in FIG. 1, the third opening/closing valve is connected to the upstream portion of the third sub-pipe 71c.

The fourth opening/closing valve 72d is a valve capable of adjusting the amount of the first refrigerant existing in the first cooling target side pipe 63a and flowing to the first heat exchanging unit 41 and is provided in the first cooling target side pipe 63n. Specifically, as illustrated in FIG. 1, the fourth opening/closing valve is connected to a portion between the first heat exchanging unit 41 and the fifth heat exchanging unit 45 in the first cooling target side pipe 63a.

The fifth opening/closing valve 72e is a valve capable of adjusting the amount of the first refrigerant subject to heat exchange by the second heat exchanging unit 42 to the inlet side pipe 62b and is provided in the second cooling target side pipe 63b. Specifically, as illustrated in FIG. 1, the fifth opening/closing valve is connected to a downstream portion in relation to the first heat exchanging unit 41 in the second cooling target side pipe 63b.

The sixth opening/closing valve 72f is a valve capable of adjusting the amount of the First refrigerant in an upstream portion in relation to the fifth heat exchanging unit 45 in the fourth sub-pipe 71d to a downstream portion in relation to the fifth heat exchanging unit 45 in the fourth sub-pipe 71d and is provided in the fourth sub-pipe 71d. Specifically, as illustrated in FIG. 1, the sixth opening/closing valve is connected to the upstream portion of the fourth sub-pipe 71d.

(Configuration—First Cooling System—Circulation Unit—First Circulation Unit—Temperature Detecting Unit)

The first temperature detecting unit 73a is a detecting section for detecting the temperature in the outlet side pipe 62a. The first temperature detecting unit 73a is configured by using, for example, a known temperature detecting sensor or the like (furthermore, the same applies to the configurations of the other temperature detecting units) and is provided in the outlet side pipe 62a. Specifically, as illustrated in FIG. 1, the first temperature detecting unit is connected to a portion in the vicinity of the compression unit 20 in the outlet side pipe 62a.

The second temperature detecting unit 73b is a detecting section for detecting the temperature in the inlet side pipe 62b and is provided in the inlet side pipe 62b. Specifically, as illustrated in FIG. 1, the second temperature detecting unit is connected to a portion in the vicinity of the compression unit 20 in the inlet side pipe 62b.

The third temperature detecting unit 73c is used to detect the temperature in the cooling target side pipe 63 and is provided in the cooling target side pipe 63. Specifically, as illustrated in FIG. 1, the third temperature detecting unit is connected to a portion between the fourth opening/closing valve 72d and the fifth heat exchanging unit 45 in the first cooling target side pipe 63a.

(Configuration—First Cooling System—Circulation Unit—First Circulation Unit—Pressure Detecting Unit)

The First pressure detecting unit 74a is used to detect the pressure in the outlet side pipe 62a.

The first pressure detecting unit 74a is configured by using, for example, a known pressure sensor or pressure switch and is provided at a plurality of positions (in FIG. 1, two positions) of the outlet side pipe 62a. Specifically, as illustrated in FIG. 1, the first pressure detecting unit is connected to a portion in the vicinity or the compression unit 20 in the outlet side pipe 62a.

The second pressure detecting unit 74b is used to detect the pressure in the inlet side pipe 62b. The second pressure detecting unit 74b is configured by using, for example, a known pressure sensor or the like (furthermore, the same applies to the third pressure detecting unit 74c, a pressure detecting unit 83 to be described later, and a delivery pressure detecting unit 136 to be described later) and is provided in the inlet side pipe 62b. Specifically, as illustrated in FIG. 1, the second pressure detecting unit is connected in a portion in the vicinity of the compression unit 20 in the inlet side pipe 62b.

The third pressure detecting unit 74c is used to detect the pressure in the cooling target side pipe 63 and is provided in the first cooling target side pipe 63a. Specifically, as illustrated in FIG. 1, the third pressure detecting unit is connected to a portion between the fourth opening/closing valve 72d and the fifth heat exchanging unit 45 in the first cooling target side pipe 63a.

(Configuration—First Cooling System—Circulation Unit—Second Circulation Unit)

The second circulation unit 80 is used to circulate the first refrigerant toward the second cooling system 100 and includes the second circulation passage 81, the temperature detecting unit 82, and the pressure detecting unit 83 as illustrated in FIG. 1.

(Configuration—First Cooling System—Circulation Unit—Second Circulation Unit—Second Circulation Passage)

The second circulation passage 81 is a passage for circulating the first refrigerant so as to exchange heat between the first refrigerant and the third refrigerant compressed by the compression unit 20. The second circulation passage 81 is configured by using, for example, a known hermetic circulation passage formed as a pipe and is provided so as to pass through the fourth heat exchanging unit 44 as illustrated in FIG. 1. The first refrigerant can be circulated by the second circulation passage 81 so as to exchange heat between the first refrigerant in the second circulation passage 81 and the third refrigerant in the first delivery passage 201 to be described later.

(Configuration—First Cooling System—Circulation Unit—Second Circulation Unit—Temperature Detecting Unit, Pressure Detecting Unit)

The temperature detecting unit 82 is used to detect the temperature in the second circulation passage 81 and is provided in the second circulation passage 81. Specifically, as illustrated in FIG. 1, the temperature detecting unit is connected to the downstream portion of the second circulation passage 81.

The pressure detecting unit 83 is used to detect the pressure in the second circulation passage 81 and is provided in the second circulation passage 81. Specifically, as illustrated in FIG. 1, the pressure detecting unit is connected to the downstream portion in the second circulation passage 81.

(Configuration—Second Cooling System)

The second cooling system 100 is a system for exchanging heat between the second refrigerant and the first refrigerant and includes an air vent portion 110, a storing unit 120, and a delivery unit 130 as illustrated in FIG. 1.

(Configuration—Second Cooling System—Air Vent Portion)

The air vent portion 110 is used to discharge air accumulated in the delivery passage 131, is configured by using, for example, a known air vent unit (as an example, an air vent tank) or the like, and is installed in the vicinity of the second heat exchanging unit 42 as illustrated in FIG. 1.

(Configuration—Second Cooling System—Storing Unit)

The storing unit 120 is used to store the second refrigerant, is configured by using, for example, a known refrigerant storing section (as an example, a reservoir tank) or the like, and is installed in the vicinity of the delivery passage 131 as illustrated in FIG. 1.

(Configuration—Second Cooling System—Delivery Unit)

The delivery unit 130 is a delivery section for delivering the second refrigerant toward the first cooling system 10 and includes the delivery passage 131, first to fourth sub-delivery pipes 132a to 132d, first to fourth delivery opening/closing valves 133a to 133d, a pump unit 134, a first delivery temperature detecting unit 135a, a second delivery temperature detecting unit 135b, the delivery pressure detecting unit 136, and a flow rate detecting unit 137 as illustrated in FIG. 1.

(Configuration—Second Cooling System—Delivery Unit—Delivery Passage)

The delivery passage 131 is a passage for delivering the second refrigerant toward the first cooling system 10. The delivery passage 131 is configured by using, for example, a known passage formed as a pipe (furthermore, the same applies to the configurations of the other delivery passages) and is provided so as to pass through a first inflow portion (not illustrated) through which the second refrigerant flows from the outside to the delivery passage 131, the first heat exchanging unit 41, the second heat exchanging unit 42, the air vent portion 110, and a first outflow portion (not illustrated) through which the second refrigerant flows from the delivery passage 131 to the outside as illustrated in FIG. 1. Specifically, the upstream end portion of the delivery passage 131 is connected to the first inflow portion and the downstream end portion of the delivery passage 131 is connected to the first outflow portion. The second refrigerant can be delivered by the delivery passage 131 so as to exchange heat between the second refrigerant in the delivery passage 131 and the first refrigerant in the first circulation passage 61.

(Configuration—Second Cooling System—Delivery Unit—Sub-Delivery Pipe)

The first sub-delivery pipe 132a is a pipe which allows the second refrigerant in the air vent portion 110 to flow into the storing unit 120 through the first sub-delivery pipe 132a. As illustrated in FIG. 1, the upstream end portion of the first sub-delivery pipe 132a is connected to the air vent portion 110 and the downstream end portion of the first sub-delivery pipe 132a is connected to the storing unit 120.

The second sub-delivery pipe 132b is a pipe which allows the second refrigerant in the storing unit 120 to flow into the air vent portion 110 through the second sub-delivery pipe 132b. As illustrated in FIG. 1, the upstream end portion of the second sub-delivery pipe 132b is connected to the storing unit 120 and the downstream end portion of the second sub-delivery pipe 132b is connected to the air vent portion 110.

The third sub-delivery pipe 132c is a pipe which allows the second refrigerant in the upstream portion of the delivery passage 131 to flow into the downstream portion of the delivery passage 131 through the third sub-delivery pipe 132c. As illustrated in FIG. 1, the upstream end portion of the third sub-delivery pipe 132c is connected to the upstream portion of the delivery passage 131 and the downstream end portion of the third sub-delivery pipe 132c is connected to the downstream portion of the delivery passage 131.

The fourth sub-delivery pipe 132d is a pipe for discharging the second refrigerant in the air vent portion 110 to a discharge portion (not illustrated) through the fourth sub-delivery pipe 132d. As illustrated in FIG. 1, the upstream end portion of the fourth sub-delivery pipe 132d is connected to the air vent portion 110 and the downstream end portion of the fourth sub-delivery pipe 132d is connected to the discharge portion.

(Configuration—Second Cooling System—Delivery Unit—Delivery Opening/Closing Valve)

The first delivery opening/closing valve 133a is a valve capable of switching whether to flow the second refrigerant from the first inflow portion to the delivery passage 131. The first delivery opening/closing valve 133a is configured by using, for example, a known opening/closing valve (as an example, a gate valve) or the like (furthermore, the same applies to the configuration of the second delivery opening/closing valve 133b) and is provided in the upstream end portion of the delivery passage 131 as illustrated in FIG. 1.

The second delivery opening/closing valve 133b is a valve capable of switching whether to flow the second refrigerant from the delivery passage 131 to the first outflow portion and is provided in the downstream end portion of the delivery passage 131 as illustrated in FIG. 1.

The third delivery opening/closing valve 133c is a valve capable of switching whether to flow the second refrigerant in the third sub-delivery pipe 132c to the downstream portion of the delivery passage 131. The third delivery opening/closing valve 133c is configured by using, for example, a known opening/closing valve (as an example, a ball valve) or the like (furthermore, the same applies to the configuration of the fourth delivery opening/closing valve 133d) and is provided in the third sub-delivery pipe 132c as illustrated in FIG. 1.

The fourth delivery opening/closing valve 133d is a valve capable of switching whether to discharge the second refrigerant in the fourth sub-delivery pipe 132d to the discharge portion and is provided in the fourth sub-delivery pipe 132d as illustrated in FIG. 1.

(Configuration—Second Cooling System—Delivery Unit—Pump Unit)

The pump unit 134 is used to deliver the second refrigerant in the delivery passage 131 from the first inflow portion toward the first outflow portion, is configured by using, for example, a known pump or the like, and is provided in the downstream portion of the delivery passage 131 as illustrated in FIG. 1.

(Configuration—Second Cooling System—Delivery Unit—Delivery Temperature Detecting Unit)

The first delivery temperature detecting unit 135a is used to detect the temperature in the delivery passage 131 and is provided in the upstream portion of the delivery passage 131 as illustrated in FIG. 1.

The second delivery temperature detecting unit 135b is used to detect the temperature in the delivery passage 131 and is provided in the downstream portion of the delivery passage 131 as illustrated in FIG. 1.

(Configuration—Second Cooling System—Delivery Unit—Delivery Pressure Detecting Unit)

The delivery pressure detecting unit 136 is used to detect the pressure in the delivery passage 131 and is provided in the downstream portion of the delivery passage 131 as illustrated in FIG. 1, (Configuration—Second Cooling System—Delivery Unit—Flow Rate Detecting Unit)

The flow rate detecting unit 137 is used to detect the flow rate of the second refrigerant in the delivery passage 131 and is provided in the downstream portion of the delivery passage 131 as illustrated in FIG. 1.

(Configuration—Third Cooling System)

The third cooling system 200 is a system for exchanging heat between the third refrigerant and the first refrigerant and includes the first delivery passage 201, the second delivery passage 202, a first delivery opening/closing valve 203, a second delivery opening/closing valve 204, and a delivery temperature detecting unit 205 as illustrated in FIG. 1.

(Configuration—Third Cooling System—Delivery Passage)

The first delivery passage 201 is a passage for delivering the third refrigerant toward the first cooling system 10 and is provided so as to pass through a second inflow portion (not illustrated) through which the third refrigerant flows from the outside to the first delivery passage 201, the third heat exchanging unit 43, and a second outflow portion (not illustrated) through which the third refrigerant flows from the first delivery passage 201 to the outside as illustrated in FIG. 1. Specifically, the upstream end portion of the first delivery passage 201 is connected to the second inflow portion and the downstream end portion of the first delivery passage 201 is connected to the second outflow portion. The third refrigerant can be delivered by the first delivery passage 201 so as to exchange heat between the third refrigerant in the first delivery passage 201 and the first refrigerant in the first circulation passage 61.

The second delivery passage 202 is a passage for delivering the third refrigerant toward the first cooling system 10 and is provided so as to pass through the fourth heat exchanging unit 44 as illustrated in FIG. 1. Specifically, the upstream end portion of the second delivery passage 202 is connected to the upstream end portion of the first delivery passage 201 and the downstream end portion of the second delivery passage 202 is connected to the downstream end portion of the first delivery passage 201. The third refrigerant can be delivered by the second delivery passage 202 so as to exchange heat between the third refrigerant in the second delivery passage 202 and the first refrigerant in the second circulation passage 81.

(Configuration—Third Cooling System—Delivery Opening/Closing Valve)

The first delivery opening/closing valve 203 is a valve capable of switching whether to flow the third refrigerant in the first delivery passage 201 to the second outflow portion. The first delivery opening/closing valve 203 is configured by using, for example, a known opening/closing valve (as an example, a ball valve) or the like and is provided in the downstream portion of the first delivery passage 201 as illustrated in FIG. 1.

The second delivery opening/closing valve 204 is a valve capable of switching whether to flow the third refrigerant in the second delivery passage 202 to the second outflow portion. The second delivery opening/closing valve 204 is configured by using, for example, a known opening/closing valve (as an example, an electromagnetic valve) or the like and is provided in the downstream portion of the second delivery passage 202 as illustrated in FIG. 1.

(Configuration—Third Cooling System—Delivery Temperature Detecting Unit)

The delivery temperature detecting unit 205 is used to detect the temperature in the first delivery passage 201 and is provided in the upstream portion of the first delivery passage 201 as illustrated in FIG. 1.

(Configuration—Control Device)

Figure 2:
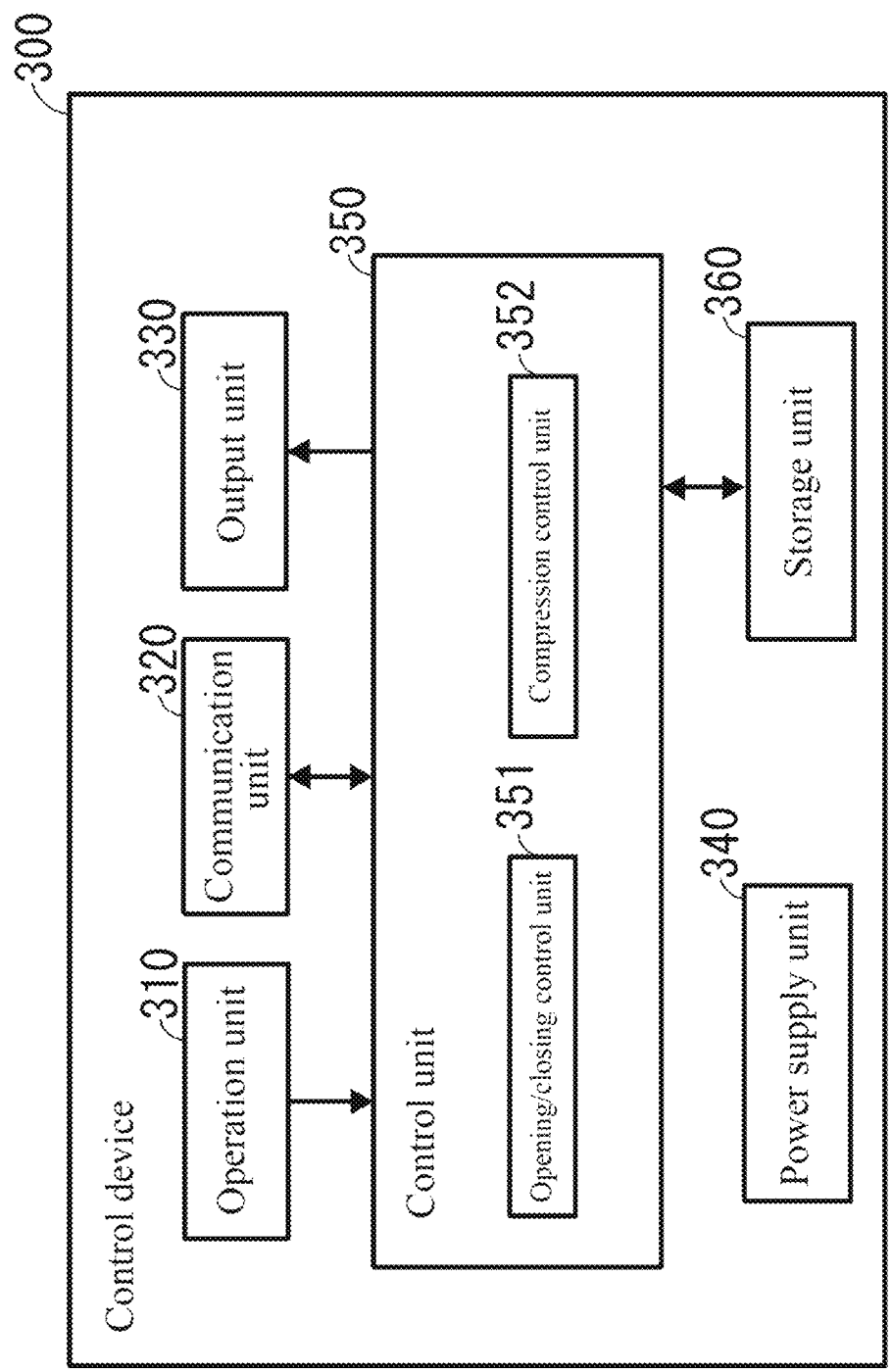
FIG. 2 is a block diagram illustrating an electric configuration of a control device.

FIG. 2 is a block diagram illustrating an electric configuration of the control device 300. The control device 300 is a device which controls each component of the cooling system 1, is provided in the vicinity of the first cooling system 10, and includes an operation unit 310, a communication unit 320, an output unit 330, a power supply unit 340, a control unit 350, and a storage unit 360 as illustrated in FIG. 2. Furthermore, in the embodiment, the control device 300 will be described on the assumption that the control device is electrically connected to each of components (for example, various opening/closing valves, various detectors, and the like) of the first cooling system 10, the second cooling system 100, and the third cooling system 200 via electrical wires, (Configuration—Control Device—Operation Unit)

The operation unit 310 is an operation section which receives an operation input for various information. The operation unit 310 is configured by using, for example, a known operation section including a touch pad, a remote operation section such as a remote controller, or a hard switch.

(Configuration—Control Device—Communication Unit)

The communication unit 320 is a communication section for communicating with each of electric components of the first cooling system 10, the second cooling system 100, and the third cooling system 200 or an external device such as a management server and is configured by using, for example, a known communication section or the like.

(Configuration—Control Device—Output Unit)

The output unit 330 is an output section for outputting various information on the basis of the control of the control unit 350 and is configured by using, for example, a known display section including a flat panel display such as a liquid crystal display or an organic EL display or an acoustic output section such as a speaker.

(Configuration—Control Device—Power Supply Unit)

The power supply unit 340 is a power supply section which supplies power supplied from a commercial power supply (not illustrated) or power stored in the power supply unit 340 to each component of the control device 300.

(Configuration—Control Device—Control Unit)

The control unit 350 is a control section which controls each component of the control device 300. The control unit 350 is specifically a computer including a CPU, various programs (a basic control program such as OS or an application program activated on the OS and realizing a specific function) analyzed and executed on the OS, and an internal memory such as a RAM for storing a program or various data.

Further, the control unit 350 conceptually includes an opening/closing control unit 351 and a compression control unit 352 as illustrated in FIG. 2.

The opening/closing control unit 351 is an opening/closing control section which controls an opening/closing state of the First opening/closing valve 72a and the second opening/closing valve 72b on the basis of the setting temperature of the second refrigerant set according to a predetermined method.

The compression control unit 352 is a compression control section which controls the compression unit 20 on the basis of the detection result of the first temperature detecting unit 73a or the second temperature detecting unit 73b and the temperature of the second refrigerant acquired according to a predetermined method. Furthermore, a detailed process executed by the control unit 350 will be described later.

(Configuration—Control Device—Storage Unit)

The storage unit 360 is a recording section which records a program and various data necessary for the operation of the control device 300 and is configured by using, for example, a hard disk (not illustrated) functioning as an external recording device. Here, instead of the hard disk or together with the hard disk, other optional recording media including a known magnetic recording medium such as a magnetic disk, an optical recording medium such as DVD and Blue-ray Disc, or a known electrical recording medium such as a Flash Rom, a USB memory, and an SD card can be used.

The cooling system 1 with the above-described configuration can effectively cool the second refrigerant by using the first refrigerant. Furthermore, the "storing unit 30", the "first sub-pipe 71a", the "second sub-pipe 71b", the "first opening/closing valve 72a", the "second opening/closing valve 72b", and the "opening/closing control unit 3511" correspond to the "refrigerant control system" of claims.

(Control Process)

Figure 3:
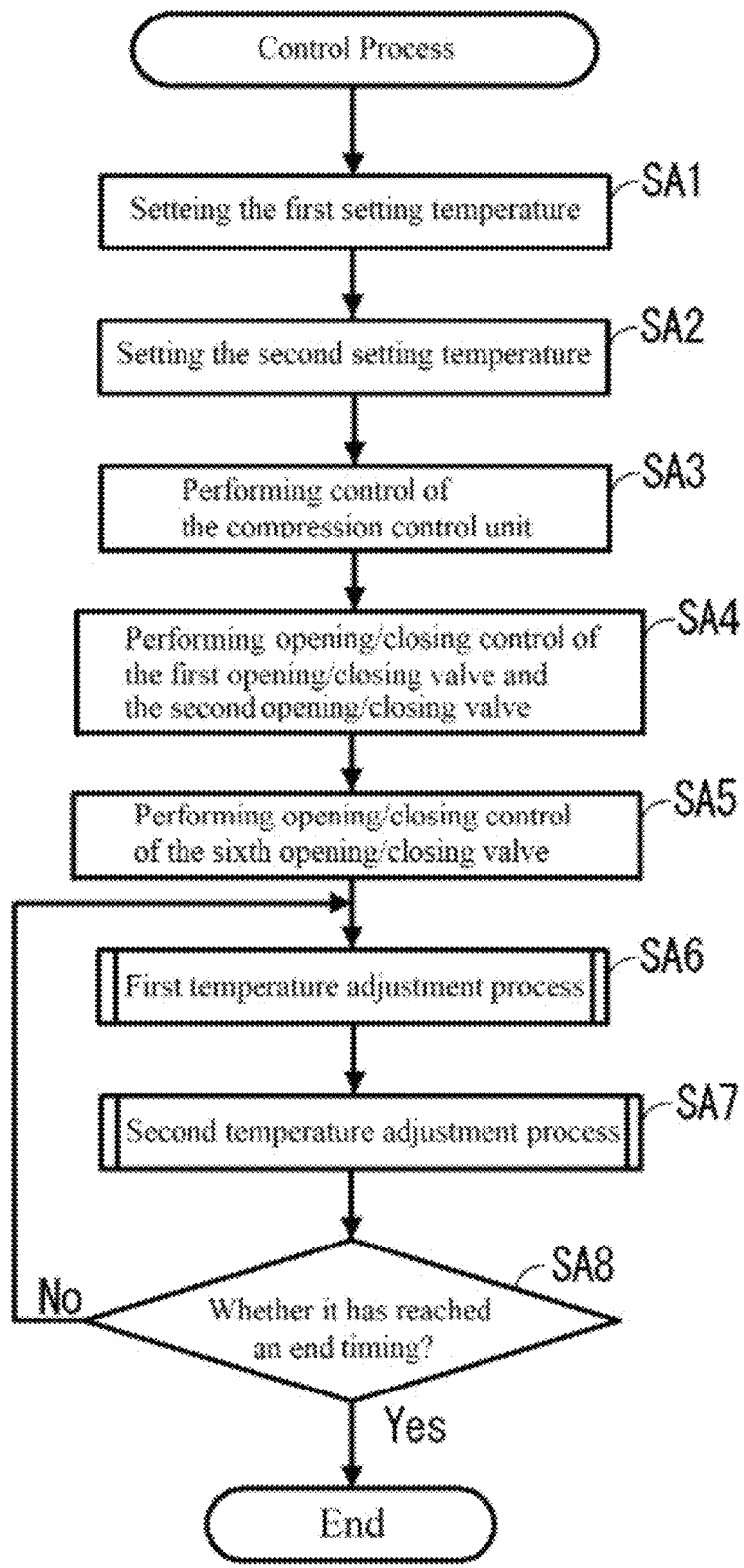
FIG. 3 is a flowchart of a control process according to the embodiment.
Figure 4A:
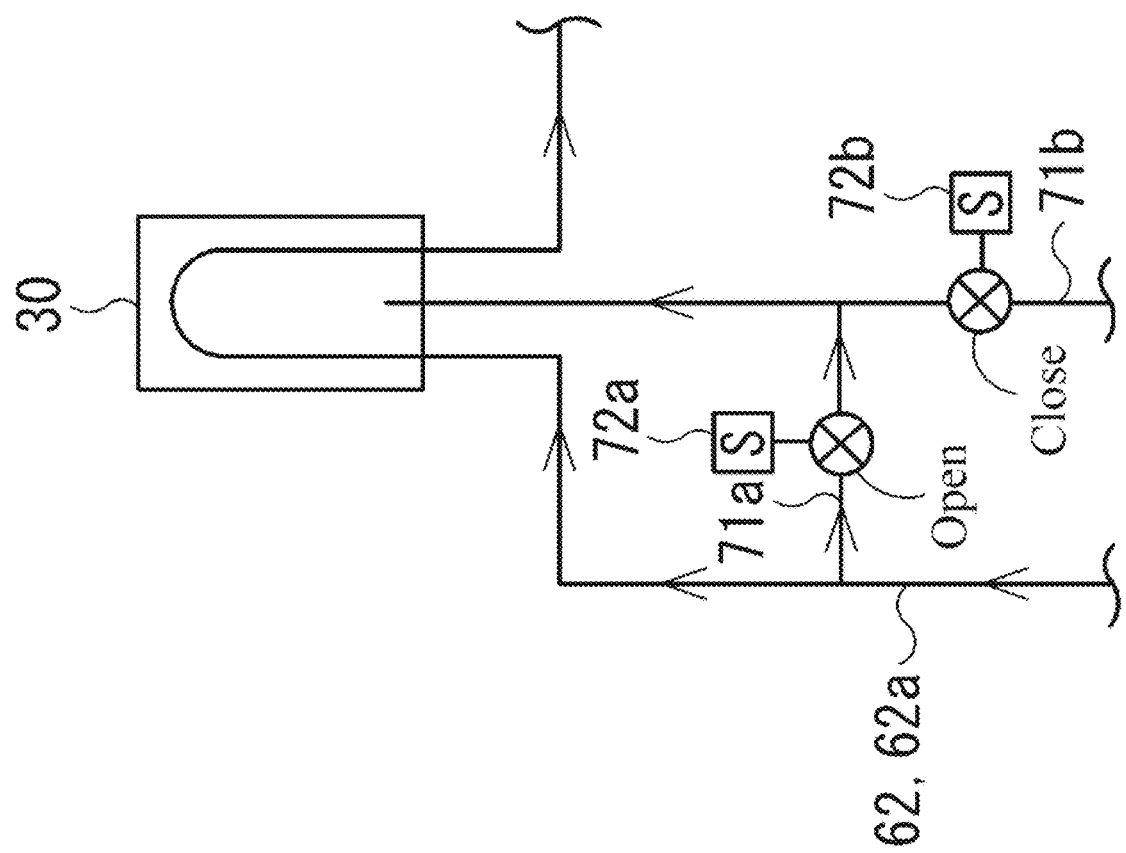
FIG. 4A and FIG. 4B are diagrams illustrating a flow of a first refrigerant as a first opening/closing valve and a second opening/closing valve are opened or closed, where
Figure 4B:
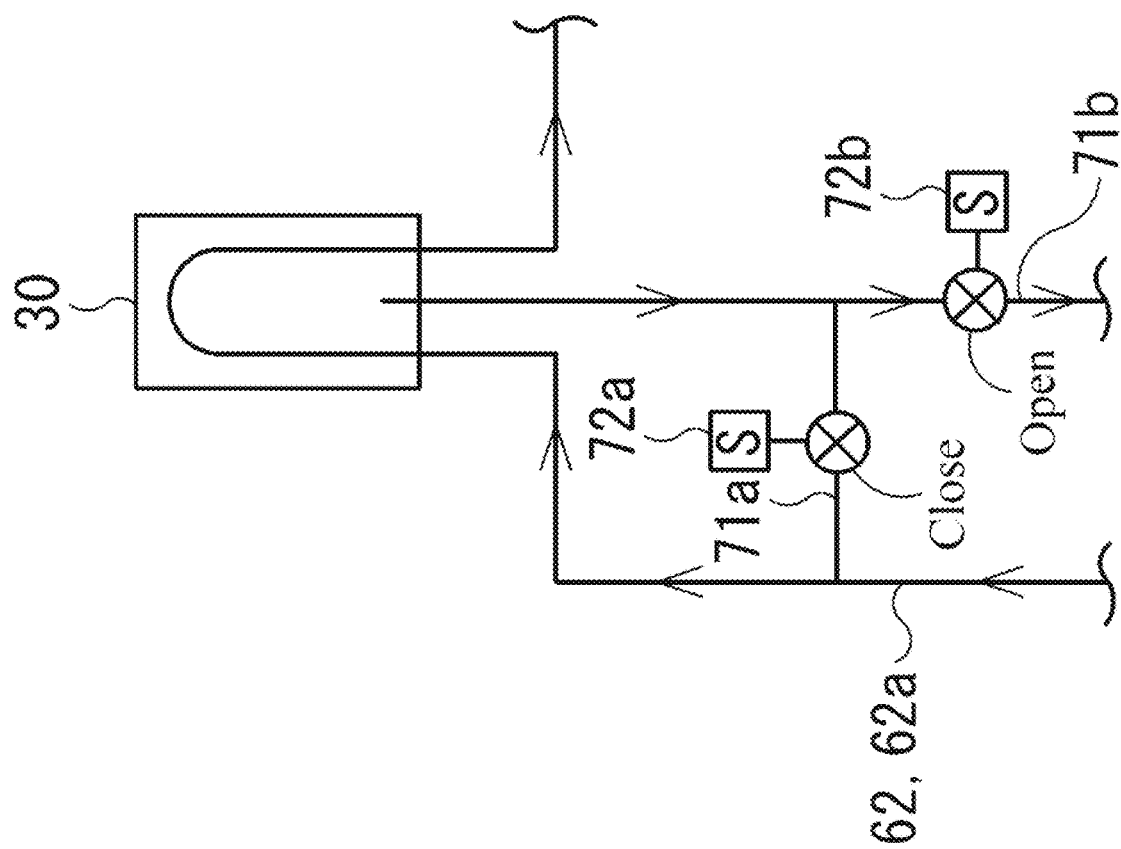

Next, the control process executed by the cooling system 1 with such a configuration will be described. FIG. 3 is a flowchart of the control process according to the embodiment (in the following description of each process, step is abbreviated as "S"). FIG. 4A and FIG. 4B are diagrams illustrating a flow of the first refrigerant as the first opening/closing valve 72a and the second opening/closing valve 72b are opened or closed, where FIG. 4A is a diagram illustrating a state in which the first opening/closing valve 72a is opened and the second opening/closing valve 72b is closed and FIG. 4B is a diagram illustrating a state in which the first opening/closing valve 72a is closed and the second opening/closing valve 72b is opened. The control process is a process for controlling the cooling system 1. The timing for executing the control process is optional, but in the embodiment, a description will be made such that the control process is activated after power is input to the cooling system 1.

Further, the premise of the control process is as follows in the embodiment. That is, it is assumed that a desired amount of the first refrigerant is stored in the compression unit 20. Regarding the open-close state of various opening/closing valves of the cooling system 1, the first opening/closing valve 72a, the third delivery opening/closing valve 133c, and the fourth delivery opening/closing valve 133d are closed, but the other opening/closing valves are opened. Accordingly, the first refrigerant can be circulated through the first circulation passage 61 and the second circulation passage 81 so that the second refrigerant flows through the delivery passage 131 and the third refrigerant flows through the first delivery passage 201 and the second delivery passage 202.

When the control process is activated, as illustrated in FIG. 3, the control unit 350 of the control device 300 sets the setting temperature of the first refrigerant (for example, about +80° C. to +90° C. and hereinafter, referred to as a "First setting temperature") in SA1. The method of setting the setting temperature of the first refrigerant is optional, but in the embodiment, information indicating the setting temperature input through the operation unit 310 is set as the setting temperature of the first refrigerant to be set. Here, the invention is not limited thereto, for example, information indicating the setting temperature stored in the storage unit 360 in advance or information indicating the setting temperature received from an external device through the communication unit 320 may be set as the setting temperature of the first refrigerant to be set (furthermore, the same applies to the method of setting the second setting temperature of SA2 to be described later).

In SA2, the control unit 350 of the control device 300 sets the setting temperature of the second refrigerant (for example, about −20° C. to +80° C. and hereinafter, referred to as a "second setting temperature").

In SA3, the compression control unit 352 of the control device 300 controls the compression unit 20 (specifically, a control of repeating the above-described operation cycle is performed). Furthermore, in the embodiment, the process of SA3 is continuously performed until the control process ends.

Here, the control method of the compression unit 20 is optional, but in the embodiment, the compression unit 20 (specifically, the operation frequency of the compression unit 20) is controlled on the basis of the detection result of the first temperature detecting unit 73a or the second temperature detecting unit 73b in the process of SA3 and the detection result of the first delivery temperature detecting unit 135a or the second delivery temperature detecting unit 135b in the process of SA3. For example, when the temperature of the second refrigerant acquired from the first delivery temperature detecting unit 135a (or the second delivery temperature detecting unit 135b) is higher than the second setting temperature set in SA2, the flow rate of the first refrigerant flowing out of the compression unit 20 is increased by increasing the operation frequency of the compression unit 20 so that the temperature of the first refrigerant acquired from the first temperature detecting unit 73*a* (or the second temperature detecting unit 73*b*) decreases. Further, when the temperature of the second refrigerant acquired from the first delivery temperature detecting unit 135*a* (or the second delivery temperature detecting unit 135*b*) is lower than the second setting temperature set in SA2, the flow rate of the first refrigerant flowing out of the compression unit 20 is decreased by decreasing the operation frequency of the compression unit 20 so that the temperature of the first refrigerant acquired from the first temperature detecting unit 73*a* (or the second temperature detecting unit 73*b*) increases. Accordingly, it is possible to control the compression unit 20 on the basis of the temperature of the first refrigerant and the temperature of the second refrigerant and to efficiently control the compression unit 20.

In SA4, the opening/closing control unit 351 of the control device 300 controls the opening/closing state of the first opening/closing valve 72*a* and the second opening/closing valve 72*b* on the basis of the second setting temperature set in SA2.

Here, the method of opening or closing the first opening/closing valve 72*a* and the second opening/closing valve 72*b* is optional, but in the embodiment, the first opening/closing valve 72*a* is opened and the second opening/closing valve 72*b* is closed when the second setting temperature is higher than the threshold temperature of the first refrigerant (for example, the threshold temperature of the first refrigerant stored in the storage unit 360 in advance). Accordingly, as illustrated in FIG. 4A, the first refrigerant in the outlet side pipe 62*a* flows into the storing unit 30. Further, the first opening/closing valve 72*a* is closed and the second opening/closing valve 72*b* is opened when the second setting temperature is lower than the threshold temperature of the first refrigerant. Accordingly, as illustrated in FIG. 4B, the first refrigerant in the storing unit 30 flows into the inlet side pipe 62*b*.

In this way, it is possible to effectively perform the inflow and the outflow of the first refrigerant in the storing unit 30 by the opening/closing control of the first opening/closing valve 72*a* and the second opening/closing valve 72*b* based on the second setting temperature. Particularly, when the second setting temperature is higher than the threshold temperature of the first refrigerant, the first refrigerant which is in a high compression state and a high density state can now from the outlet side pipe 62*a* into the storing unit 30. Accordingly, it is possible to effectively prevent an excessive increase in pressure of the First circulation passage 61 or an excessive increase in cooling capacity when the second setting temperature is high. Further, when the second setting temperature is lower than the threshold temperature of the first refrigerant, the first refrigerant in the storing unit 30 can now into the inlet side pipe 62*b* and the refrigerant amount of the first circulation passage 61 can be increased by that amount. As a result, it is possible to recover the pressure in the first circulation passage 61 decreasing with a decrease in the second setting temperature and to easily maintain the function of the first circulation passage 61. Thus, since it is easy to maintain the function of the compression unit 20, the function of the storing unit 30, and the function of the first circulation passage 61, it is possible to maintain the usability of the cooling system L. Further, since the first refrigerant is carbon dioxide, it is possible to prevent an excessive increase in pressure of the first circulation passage 61 even when the refrigerant easily expands as compared with a Freon gas. Further, since the second refrigerant is the cooling refrigerant of the semiconductor fabrication system, it is possible to prevent an excessive increase in pressure of the first circulation passage 61 even when the temperature range of the second refrigerant is relatively wide and to prevent a decrease in now rate of the first refrigerant in the first circulation passage 61 when the first refrigerant is condensed in the storing unit 30.

Returning to FIG. 3, in SA5, the opening/closing control unit 351 of the control device 300 controls the open-close state of the sixth opening/closing valve 72*f*. Furthermore, in the embodiment, the process of SA5 is continuously performed until the control process ends.

Here, the method of opening or closing the sixth opening/closing valve 72*f* is optional, but in the embodiment, the method is performed on the basis of the second setting temperature. For example, when the second setting temperature is lower than the threshold value stored in the storage unit 360 in advance, the sixth opening/closing valve 72*f* is opened to a predetermined opening degree. Accordingly, since the first refrigerant in an upstream portion in relation to the fifth heat exchanging unit 45 in the fourth sub-pipe 71*d* flows to a downstream portion in relation to the fifth heat exchanging unit 45 in the fourth sub-pipe 71*d*, the heat exchange of the first refrigerant is performed by the fifth heat exchanging unit 45. Further, the sixth opening/closing valve 72*f* is closed when the second setting temperature is higher than the threshold value. Accordingly, since the first refrigerant in an upstream portion in relation to the fifth heat exchanging unit 45 in the fourth sub-pipe 71*d* does not now to a downstream portion in relation to the fifth heat exchanging unit 45 in the fourth sub-pipe 71*d*, the heat exchange of the first refrigerant is not performed by the fifth heat exchanging unit 45.

With such a process, it is possible to adjust the opening degree of the sixth opening/closing valve 72*f* on the basis of the second setting temperature and to efficiently adjust the temperature of the first refrigerant in the first cooling target side pipe 63*a*.

After the process of SA5, the opening/closing control unit 351 of the control device 300 activates a first temperature adjustment process (SA6).

(Control Process—First Temperature Adjustment Process)

Next, the first temperature adjustment process (SA6) will be described. FIG. 5 is a flowchart of the first temperature adjustment process. The first temperature adjustment process is a process for adjusting the temperature of the first refrigerant in the cooling target side pipe 63.

When the first temperature adjustment process is activated, the opening/closing control unit 351 of the control device 300 acquires the temperature of the second refrigerant from the first delivery temperature detecting unit 135*a* (or the second delivery temperature detecting unit 135*b*) in SB1 as illustrated in FIG. 5.

In SB2, the opening/closing control unit 351 of the control device 300 determines whether the temperature of the second refrigerant acquired in SB1 is the second setting temperature. Then, when it is not determined that the temperature of the second refrigerant is the second setting temperature (SB2, No), the opening/closing control unit 351 of the control device 300 proceeds to SB3. Meanwhile, when it is determined that the temperature of the second refrigerant is the second setting temperature (SB2, Yes), the opening/closing control unit ends the first temperature adjustment process and returns to the control process of FIG. 3.

In SB3, the opening/closing control unit 351 of the control device 300 controls the opening degree of the fourth opening/closing valve 72d and the fifth opening/closing valve 72e on the basis of the temperature of the second refrigerant acquired in SB1. Then, the opening/closing control unit 351 of the control device 300 proceeds to SB1 and repeats the process from SB1 to SB3 until it is determined that the temperature of the second refrigerant is the second setting temperature in SB2.

Further, the method of controlling the opening degree of the fourth opening/closing valve 72d and the fifth opening/closing valve 72e is optional, but for example, when the temperature of the second refrigerant acquired in SB1 is higher than the second setting temperature set in SA2, the opening degree of the fourth opening/closing valve 72d is set to be wider than the first reference opening degree and the opening degree of the fifth opening/closing valve 72e is set to be narrower than the first reference opening degree. Accordingly, since the heating amount of the second heat exchanging unit 42 decreases when the amount of the first refrigerant existing in the first cooling target side pipe 63a and flowing to the first heat exchanging unit 41 increases and the amount of the first refrigerant subjected to the heat exchange by the second heat exchanging unit 42 and flowing to the inlet side pipe 62b decreases, the cooling of the second refrigerant by the first refrigerant is promoted. Further, when the temperature of the second refrigerant acquired in SB1 is lower than the second setting temperature set in SA2, the opening degree of the fourth opening/closing valve 72d is set to be narrower than the first reference opening degree and the opening degree of the fifth opening/closing valve 72e is set to be wider than the first reference opening degree. Accordingly, since the heating amount of the second heat exchanging unit 42 increases when the amount of the first refrigerant existing in the first cooling target side pipe 63a and flowing to the first heat exchanging unit 41 decreases and the amount of the first refrigerant subjected to the heat exchange by the second heat exchanging unit 42 and flowing to the inlet side pipe 62b increases, the cooling of the second refrigerant by the first refrigerant is suppressed. Furthermore, the "first reference opening degree" means the opening degree of the opening valve, for example, when the temperature of the second refrigerant is equal to the second setting temperature.

With such a process, it is possible to adjust the opening degree of the fourth opening/closing valve 72d and the fifth opening/closing valve 72e on the basis of the temperature of the second refrigerant and to efficiently adjust the temperature of the first refrigerant in the cooling target side pipe 63 in response to the temperature of the second refrigerant.

With the first temperature adjustment process, it is possible to adjust the temperature of the first refrigerant in the cooling target side pipe 63 so that the temperature of the second refrigerant becomes the second setting temperature and to efficiently cool the second refrigerant.

Returning to FIG. 3, the opening/closing control unit 351 of the control device 300 activates a second temperature adjustment process (SA7) after the process of SA6.

(Control Process—Second Temperature Adjustment Process)

Next, the second temperature adjustment process (SA7) will be described. FIG. 6 is a flowchart of the second temperature adjustment process. The second temperature adjustment process is a process for adjusting the temperature of the first refrigerant in the outlet side pipe 62a.

When the second temperature adjustment process is activated, as illustrated in FIG. 6, in SC1, the opening/closing control unit 351 of the control device 300 acquires the temperature of the first refrigerant from the first temperature detecting unit 73a (or the second temperature detecting unit 73b).

In SC2, the opening/closing control unit 351 of the control device 300 determines whether the temperature of the first refrigerant acquired in SC1 is lower than the First setting temperature. Then, when it is not determined that the temperature of the first refrigerant is lower than the first setting temperature (SC2, No), the opening/closing control unit 351 of the control device 300 proceeds to SC3. Meanwhile, when it is determined that the temperature of the first refrigerant is lower than the first setting temperature (SC2, Yes), the opening/closing control unit ends the second temperature adjustment process and returns to the control process of FIG. 3.

In SC3, the opening/closing control unit 351 of the control device 300 controls the opening degree of the third opening/closing valve 72c on the basis of the temperature of the first refrigerant acquired in SC1. Then, the opening/closing control unit 351 of the control device 300 proceeds to SC1 and repeats the process from SC1 to SC3 until it is determined that the temperature of the first refrigerant is lower than the first setting temperature in SC2.

Further, the method of controlling the opening degree of the third opening/closing valve 72c is optional, but for example, when the temperature of the first refrigerant acquired in SC1 is higher than the first setting temperature set in SA1, the opening degree of the third opening/closing valve 72c is set to be wider than the second reference opening degree. Accordingly, since the amount of the first refrigerant existing in the cooling target side pipe 63 and flowing to the inlet side pipe 62b increases, the temperature of the first refrigerant in the outlet side pipe 62a can be decreased. Further, when the temperature of the first refrigerant acquired in SC1 is equal to the first setting temperature set in SA1, the opening degree of the third opening/closing valve 72c is maintained at the second reference opening degree. Accordingly, since the amount of the first refrigerant existing in the cooling target side pipe 63 and flowing to the inlet side pipe 62b is maintained, an increase in temperature of the First refrigerant in the outlet side pipe 62a can be suppressed. Furthermore, the "second reference opening degree" means, for example, the opening degree of the opening valve when the temperature of the first refrigerant is equal to the first setting temperature.

With such a process, it is possible to adjust the opening degree of the third opening/closing valve 72c on the basis of the temperature of the first refrigerant and to efficiently adjust the temperature of the first refrigerant in the outlet side pipe 62a.

With the second temperature adjustment process, it is possible to adjust the temperature of the first refrigerant in the outlet side pipe 62a so that the temperature of the first refrigerant becomes the first setting temperature. Thus, when the first refrigerant in the outlet side pipe 62a flows to the storing unit 30 through the first sub-pipe 71a, the temperature in the storing unit 30 is easily maintained at the threshold temperature or more of the first refrigerant by the heat of the flowing first refrigerant.

Returning to FIG. 3, in SA8, the control unit 350 of the control device 300 determines whether it has reached a timing (hereinafter, referred to as an "end timing") of ending the control process. The method of determining whether it has reached the end timing is optional. For example, the timing may be determined on the basis of whether a predetermined operation is received through the operation unit 310. Here, the end timing is determined when the predetermined operation is received and the end timing is not determined when the predetermined operation is not received. Then, when it is determined that it has reached the end timing (SA8, Yes), the control unit 350 of the control device 300 ends the control process. Meanwhile, when it is not determined that it has reached the end timing (SA8, No), the routine proceeds to SA6 and proceeds from SA6 to SA8 until it is determined that it has reached the end timing in SA8.

With the above-described control process, it is possible to effectively cool the second refrigerant by using the first refrigerant while maintaining the usability of the cooling system 1.

Effect of Embodiment

In this way, according to the embodiment, since there are provided the first sub-pipe 71a connected to the outlet side pipe 62a and flowing the first refrigerant in the outlet side pipe 62a to the storing unit 30 through the first sub-pipe 71a and the second sub-pipe 71b connected to the inlet side pipe 62b and flowing the first refrigerant in the storing unit 30 to the inlet side pipe 62b through the second sub-pipe 71b, it is easy to maintain the temperature in the storing unit 30 at the threshold temperature (or a superheated steam temperature) or more of the first refrigerant by the heat of the first refrigerant flowing to the storing unit 30 while suppressing an excessive increase in pressure in the first circulation passage 61. Accordingly, it is possible to suppress a decrease in amount of the first refrigerant in the first circulation passage 61 when the First refrigerant is condensed in the storing unit 30. Particularly, since the first sub-pipe 71a is connected to the outlet side pipe 62a, it is possible to store the refrigerant in a high compression state and a high density state as compared with a case in which the first sub-pipe 71a is connected to the inlet side pipe 62b. As a result, it is possible to prevent an excessive increase in pressure in the first circulation passage 61 or an excessive increase in cooling capacity when the second setting temperature is high. Further, since the first refrigerant in the storing unit 30 can flow into the inlet side pipe 62b and the temperature in the inlet side pipe 62b can be increased by the heat of the flowing first refrigerant, it is possible to suppress the deterioration of the function or failure of the compression unit 20 due to the saturated steam flowing to the compression unit 20. Further, since there are provided the first opening/closing valve 72a capable of switching whether to flow the first refrigerant in the outlet side pipe 62a to the storing unit 30, the second opening/closing valve 72b capable of switching whether to low the first refrigerant in the storing unit 30 to the inlet side pipe 62b, and the opening/closing control unit 351 controlling the opening/closing state of the first opening/closing valve 72a and the second opening/closing valve 72b on the basis of the second setting temperature set according to a predetermined method, it is possible to effectively perform the inflow and the outflow of the first refrigerant in the storing unit 30 by the opening/closing control of the first opening/closing valve 72a and the second opening/closing valve 72b based on the second setting temperature. As described above, since it is easy to maintain the function of the compression unit 20, the function of the storing unit 30, and the function of the first circulation passage 61 as compared with the related an (a technique of simply flowing the refrigerant in the low source refrigeration cycle to the expansion tank), it is possible to maintain the usability of the refrigerant control system (or the cooling system 1).

Further, since the opening/closing control unit 351 opens the first opening/closing valve 72a and closes the second opening/closing valve 72b when the second setting temperature is higher than the threshold temperature of the first refrigerant and closes the first opening/closing valve 72a and opens the second opening/closing valve 72b when the second setting temperature is lower than the threshold temperature of the first refrigerant, the first refrigerant which is in a high compression state and a high density state can flow from the outlet side pipe 62a to the storing unit 30 when the second setting temperature is higher than the threshold temperature of the first refrigerant. Accordingly, it is possible to more effectively prevent an excessive increase in pressure in the first circulation passage 61 or an excessive increase in cooling capacity when the second setting temperature is high. Further, when the second setting temperature is lower than the threshold temperature of the first refrigerant, the first refrigerant in the storing unit 30 can flow into the inlet side pipe 62b and the refrigerant amount of the first circulation passage 61 can be increased by that amount. As a result, it is possible to recover the pressure in the first circulation passage 61 decreasing with a decrease in the second setting temperature and to easily maintain the function of the first circulation passage 61.

Further, since the first refrigerant is carbon dioxide, it is possible to prevent an excessive increase in pressure in the first circulation passage 61 even when the first refrigerant easily expands as compared with a Freon gas.

Further, since the second refrigerant is the cooling refrigerant of the semiconductor fabrication system, it is possible to prevent an excessive increase in pressure in the first circulation passage 61 even when the temperature range of the second refrigerant is relatively wide and to suppress a decrease in flow rate of the first refrigerant in the first circulation passage 61 when the first refrigerant is condensed in the storing unit 30.

Further, since the heat exchanging section includes the first heat exchanging unit 41 capable of cooling the second refrigerant and the second heat exchanging unit 42 capable of heating the second refrigerant cooled by the first heat exchanging unit 41, the cooling target side pipe 63 includes the first cooling target side pipe 63a located on the side of the first heat exchanging unit 41 and the second cooling target side pipe 63b located on the side of the second heat exchanging unit 42, provided are the third sub-pipe 71c connected to the inlet side pipe 62b and an upstream portion in relation to the first heat exchanging unit 41 in the first cooling target side pipe 63a and the third opening/closing valve 72c capable of adjusting the amount of the first refrigerant existing in the cooling target side pipe 63 and flowing to the inlet side pipe 62b, and the opening/closing control unit 351 controls the opening degree of the third opening/closing valve 72c on the basis of the detection result of the first temperature detecting unit 73a (or the second temperature detecting unit 73b), it is possible to adjust the opening degree of the third opening/closing valve 72c on the basis of the temperature of the first refrigerant and to efficiently adjust the temperature of the first refrigerant in the outlet side pipe 62a.

Further, since there are provided the fourth opening/closing valve 72d capable of adjusting the amount of the first refrigerant existing in the first cooling target side pipe 63a and flowing to the first heat exchanging unit 41 and the filth opening/closing valve 72e capable of adjusting the amount of the first refrigerant subjected to the heat exchange by the second heat exchanging unit 42 and flowing to the inlet side pipe 62b and the opening/closing control unit 351 controls the opening degree of the fourth opening/closing valve 72d and the fifth opening/closing valve 72e on the basis of the temperature of the second refrigerant acquired according to a predetermined method, it is possible to adjust the temperature of the first refrigerant in the cooling target side pipe 63 so that the temperature of the second refrigerant becomes the second setting temperature and to efficiently cool the second refrigerant.

Further, since there is provided the sixth heat exchanging unit 46 which exchanges heat between the first refrigerant in an upstream portion in relation to the first heat exchanging unit 41 in the first cooling target side pipe 63a and the first refrigerant in a downstream portion in relation to the second heat exchanging unit 42 in the second cooling target side pipe 63b, it is possible to increase the temperature of the first refrigerant in a downstream portion in relation to the second heat exchanging unit 42 in the second cooling target side pipe 63b and to flow the dried first refrigerant to the compression unit 20.

Further, since there is provided the compression control unit 352 which controls the compression unit 20 on the basis of the detection result of the first temperature detecting unit 73a (or the second temperature detecting unit 73b) and the temperature of the second refrigerant acquired according to a predetermined method, it is possible to control the compression unit 20 on the basis of the temperature of the first refrigerant and the temperature of the second refrigerant and to efficiently control the compression unit 20.

[III] Modified Example of Embodiment

Although the embodiment of the invention has been described, detailed configurations and sections of the invention can be arbitrarily modified and improved within the scope of the technical spirit of the invention described in claims. Hereinafter, such modified examples will be described.

Problem to be Solved or Effect of Invention

Above all, the problem to be solved by the invention or the effect of the invention is not limited to the above-described contents. Further, the problem not described above can be solved or the effect not described above can be obtained by the invention. Furthermore, only a part of the problems described above can be solved or only a part of the effect described above can be obtained.

(Distribution or Integration)

Further, each electrical component described above is functionally conceptual and does not necessarily need to be physically configured as illustrated in the drawings. That is, detailed forms of the distribution or integration of each component is not limited to one illustrated in the drawings and all or a part of them can be functionally or physically distributed or integrated by an arbitrary unit in response to various loads or a use state. Further, the "system" in the specification is not limited to one including a plurality of devices, but includes one configured as a single device. Further, the "device" of the specification is not limited to one configured as a single device, but includes one including a plurality of devices. Further, each a data structure of information described in the embodiment may be arbitrarily modified. For example, the control device 300 may include a plurality of devices which are distributed so as to communicate with each other. Further, the control unit 350 may be provided in a part of the plurality of devices and the storage unit 360 may be provided in another part of the plurality of devices.

(Shape, Numerical Value, Structure, and Time Series)

Regarding the components exemplified in the embodiment and the drawings, the shapes, the numerical values, and the structures of the plurality of components or the mutual time-series relationship may be arbitrarily modified and improved within the scope of the technical spirit of the invention.

(Third Refrigerant)

Figure 7:
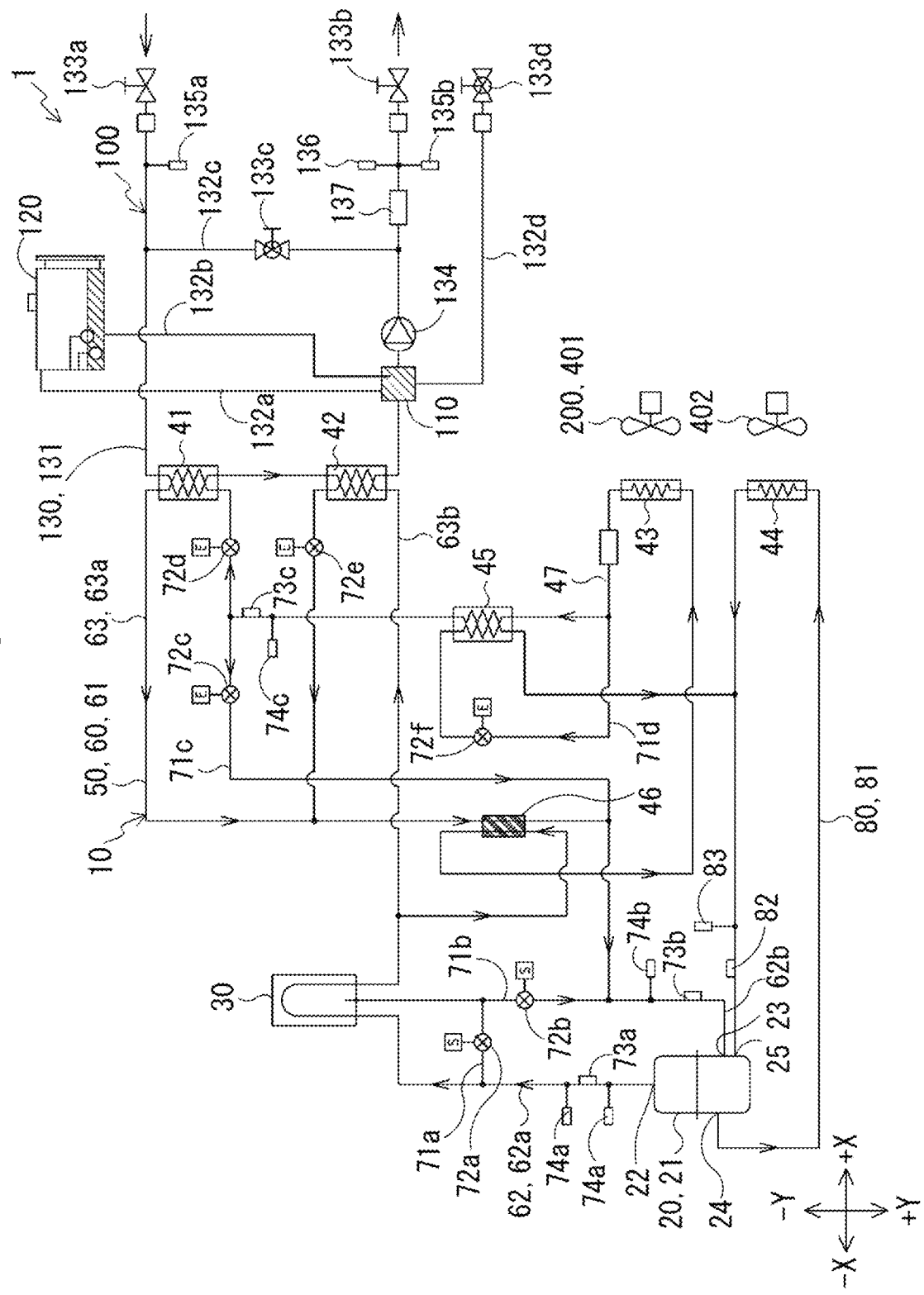
FIG. 7 is a diagram illustrating a modified example of the cooling system.

In the above-described embodiment, it has been described such that the third refrigerant is industrial water, but the invention is not limited thereto. FIG. 7 is a diagram illustrating a modified example of the cooling system 1. For example, the third refrigerant may be air. In this case, as illustrated in FIG. 7, the third cooling system 200 may include a first delivery unit 401 (as an example, a known blower) which delivers the third refrigerant to the third heat exchanging unit 43 and a second delivery unit 402 (as an example, a known blower) which delivers the third refrigerant to the fourth heat exchanging unit 44.

(First Cooling System)

In the above-described embodiment, it has been described such that the first cooling system 10 includes the fifth heat exchanging unit 45, the sixth heat exchanging unit 46, and the removal unit 47, but the invention is not limited thereto. For example, at least one of the fifth heat exchanging unit 45, the sixth heat exchanging unit 46, and the removal unit 47 may be omitted. Furthermore, when the fifth heat exchanging unit 45 is omitted, the fourth sub-pipe 71d and the sixth opening/closing valve 72f can be omitted.

Further, in the above-described embodiment, it has been described such that the first cooling system 10 includes the third opening/closing valve 72c, the fourth opening/closing valve 72d, the fifth opening/closing valve 72e, and the sixth opening/closing valve 72f, but the invention is not limited thereto. For example, at least one of the third opening/closing valve 72c, the fourth opening/closing valve 72d, the fifth opening/closing valve 72e, and the sixth opening/closing valve 72f may be omitted. Furthermore, when the third opening/closing valve 72c is omitted, the process of SA7 of the control process can be omitted. Further, when the fourth opening/closing valve 72d and the fifth opening/closing valve 72e are omitted, the process of SA6 of the control process can be omitted. Further, when the sixth opening/closing valve 72f is omitted, the process of SA5 of the control process can be omitted.

Figure 8:
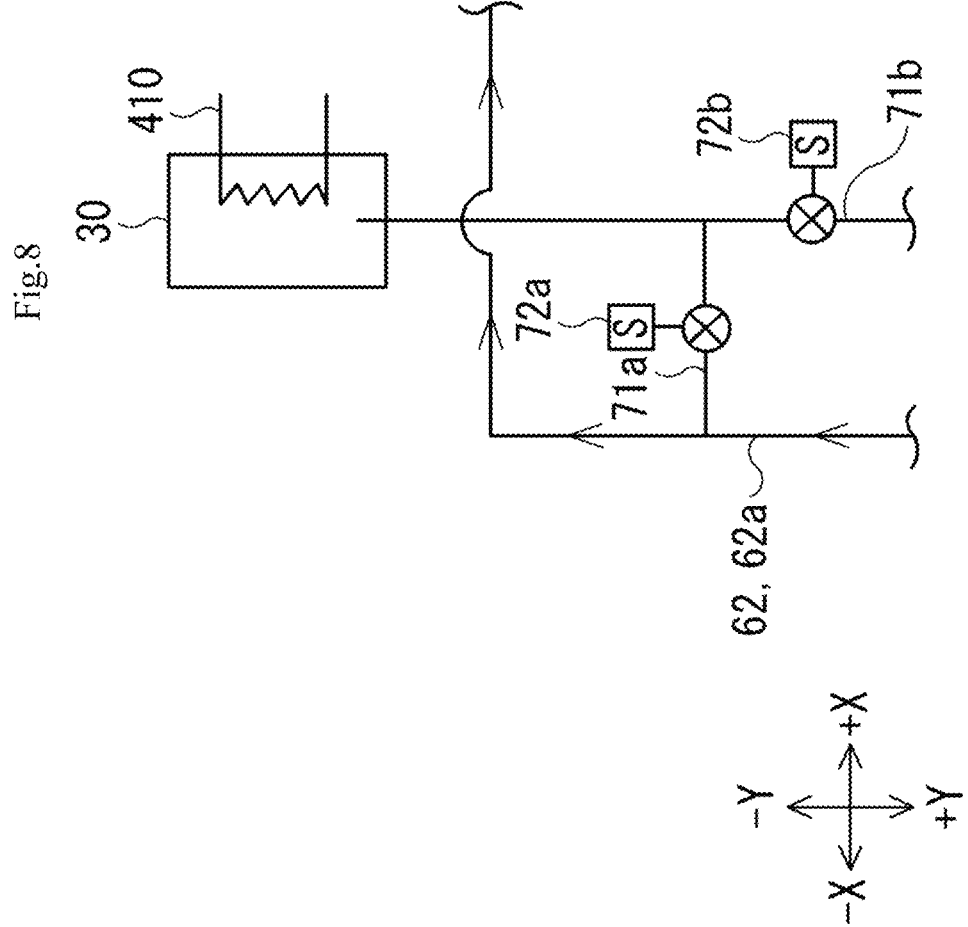
FIG. 8 is a diagram illustrating an installation state of a temperature adjustment unit.
Figure 9:
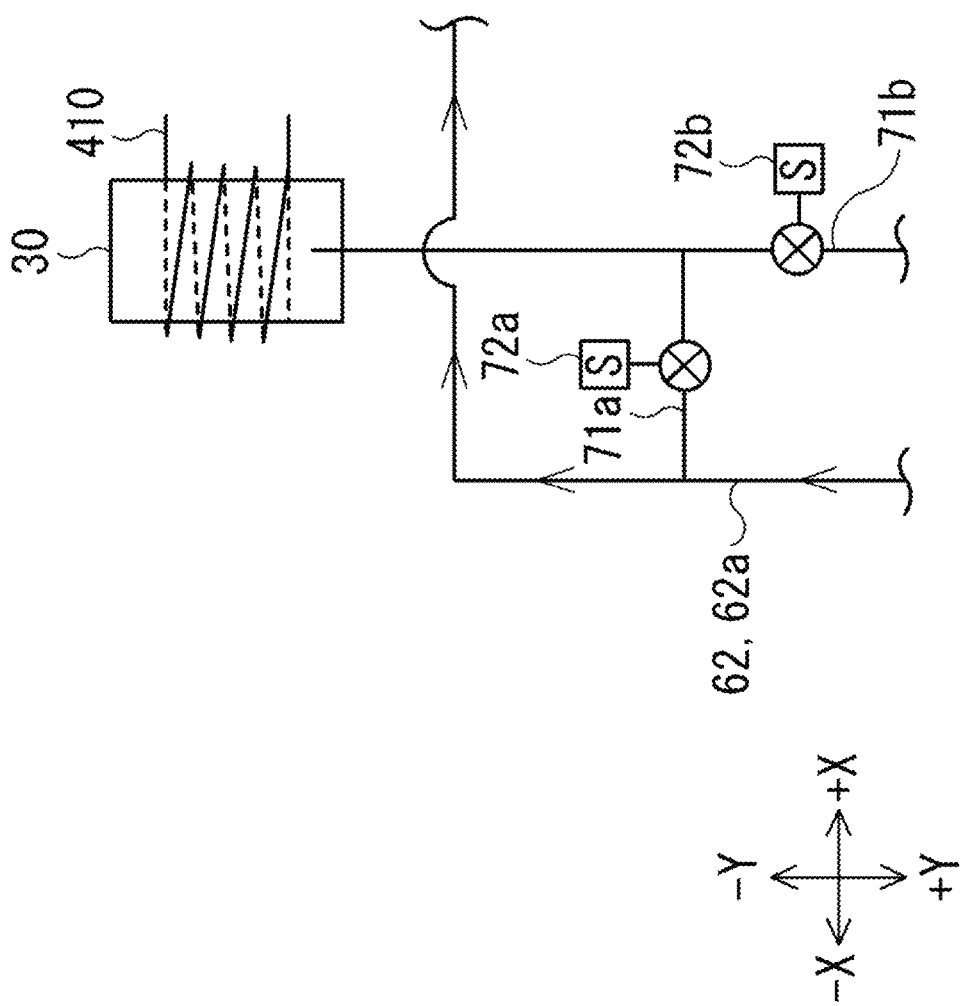
FIG. 9 is a diagram illustrating an installation state of the temperature adjustment unit.

Further, in the above-described embodiment, it has been described such that the first cooling system 10 includes the compression unit 20, the storing unit 30, the first to sixth heat exchanging units 41 to 46, the removal unit 47, and the circulation unit 50, but the invention is not limited thereto. For example, a temperature adjustment unit 410 may be provided in addition to these components. FIGS. 8 and 9 are diagrams illustrating an installation state of the temperature adjustment unit 410. Here, the temperature adjustment unit 410 is a temperature adjusting section for adjusting the temperature of the first refrigerant in the storing unit 30, is configured by using, for example, a known temperature controller (as an example, a temperature controller having at least one of a heating function and a cooling function) or the like, and is installed in the storing unit 30. Further, the method of installing the temperature adjustment unit 410 is optional, but may be installed in the storing unit 30, for example, as illustrated in FIG. 8. Alternatively, as illustrated in FIG. 9, the temperature adjustment unit may be installed so as to wrap around the storing unit 30 outside the storing unit 30. With the temperature adjustment unit 410, it is possible to adjust the temperature of the refrigerant in the storing unit 30 and to suppress a decrease in amount of the refrigerant in the first circulation passage 61, for example, when the refrigerant in the storing unit 30 is condensed.

(Storing Unit)

In the above-described embodiment, it has been described such that the number of the installed storing units 30 is one, but the invention is not limited thereto. For example, the number of the installed storing units 30 may be two or more. In this case, when the first sub-pipe 71a and the second sub-pipe 71b are installed in each storing unit 30, it is possible to perform the inflow and the outflow of the first refrigerant in each storing unit 30.

Further, in the above-described embodiment, it has been described such that a part of the outlet side pipe 62a is stored in the storing unit 30, but the invention is not limited thereto. For example, the outlet side pipe 62a may not be stored in the storing unit 30 (that is, as illustrated in FIGS. 8 and 9, the entire outlet side pipe 62a may be installed at a position separated from the storing unit 30 outside the storing unit 30 or may be installed so as to wrap around the storing unit 30 outside the storing unit 30).

(Compression Unit)

In the above-described embodiment, it has been described such that the compression unit 20 is an operation frequency control operation type compressor, but the invention is not limited thereto. For example, the compression unit may be a constant speed operation type compressor.

Figure 10:
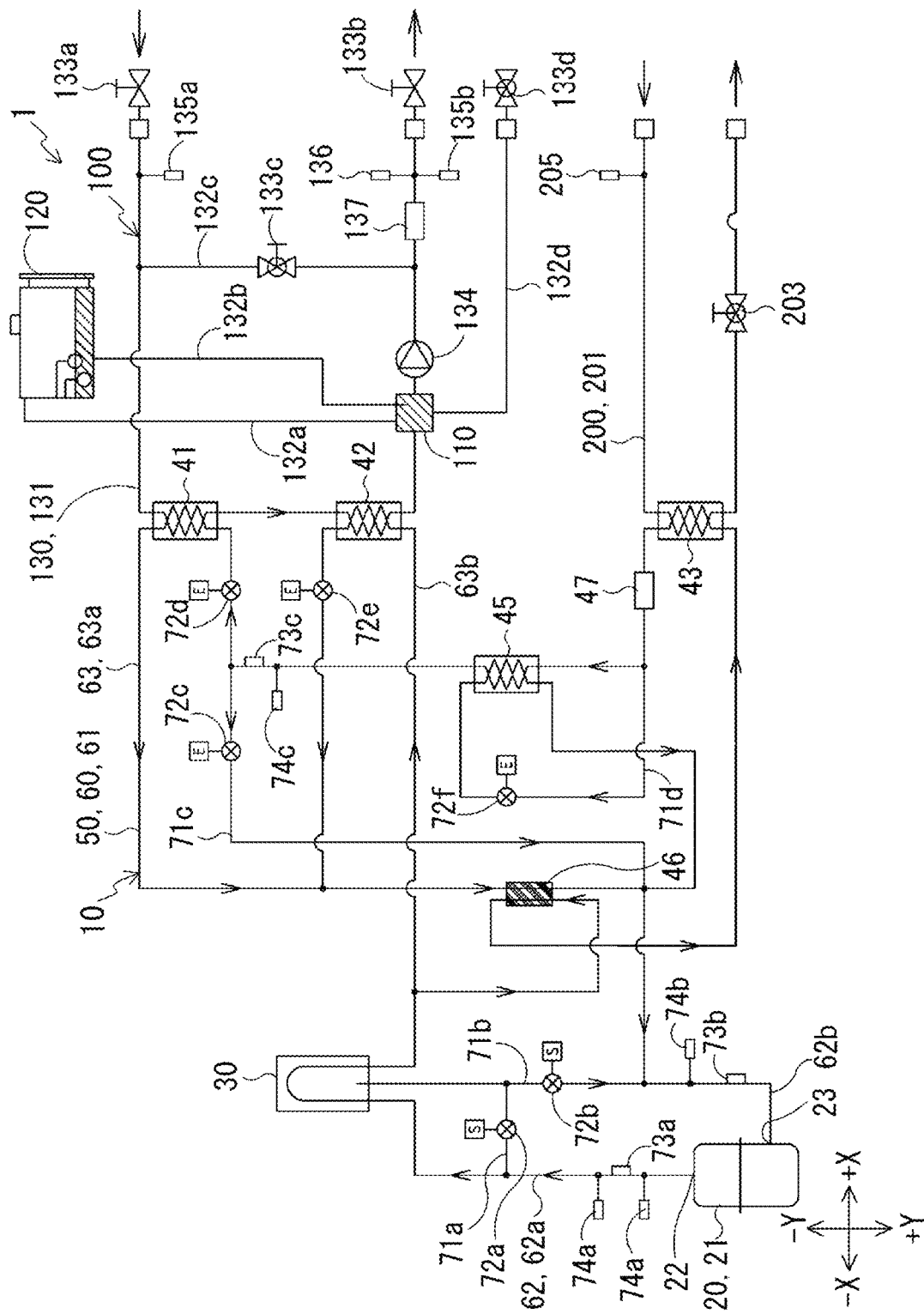
FIG. 10 is a diagram illustrating a modified example of the cooling system.

Further, in the above-described embodiment, it has been described such that the compression unit 20 includes a double-stage compressor, but the invention is not limited thereto. FIG. 10 is a diagram illustrating a modified example of the cooling system 1. For example, the compression unit 20 may be a single-stage compressor. In this case, as illustrated in FIG. 10, the cooling system 1 can omit the fourth heat exchanging unit 44, the second circulation unit 80, the second delivery passage 202, and the second delivery opening/closing valve 204 as compared with the cooling system 1 of FIG. 1.

(Second Cooling System)

In the above-described embodiment, it has been described such that the second cooling system 100 includes the air vent portion 110, the storing unit 120, the first to fourth sub-delivery pipes 132a to 132d, the first to fourth delivery opening/closing valves 133a to 133d, the pump unit 134, the first delivery temperature detecting unit 135a, the second delivery temperature detecting unit 135b, the delivery pressure detecting unit 136, and the flow rate detecting unit 137, but the invention is not limited thereto. For example, at least one of the air vent portion 110, the storing unit 120, the first to fourth sub-delivery pipes 132a to 132d, the first to fourth delivery opening/closing valves 133a to 133d, the pump unit 134, the first delivery temperature detecting unit 135a, the second delivery temperature detecting unit 135b, the delivery pressure detecting unit 136, and the flow rate detecting unit 137 may be omitted.

(Third Cooling System)

In the above-described embodiment, it has been described such that the third cooling system 200 includes the first delivery opening/closing valve 203, the second delivery opening/closing valve 204, and the delivery temperature detecting unit 205, but the invention is not limited thereto. For example, at least one of the first delivery opening/closing valve 203, the second delivery opening/closing valve 204, and the delivery temperature detecting unit 205 may be omitted.

(Control Process)

In the above-described embodiment, it has been described such that the operation frequency of the compression unit 20 is controlled on the basis of the detection result of the First temperature detecting unit 73a or the second temperature detecting unit 73b and the detection result of the first delivery temperature detecting unit 135a or the second delivery temperature detecting unit 135b in SA3, but the invention is not limited thereto. For example, the operation frequency of the compression unit 20 may be controlled at a constant frequency.

Further, in the above-described embodiment, it has been described such that the first opening/closing valve 72a is opened and the second opening/closing valve 72b is closed when the second setting temperature is higher than the threshold temperature of the first refrigerant and the first opening/closing valve 72a is closed and the second opening/closing valve 72b is opened when the second setting temperature is lower than the threshold temperature of the first refrigerant in the process of SA4, but the invention is not limited thereto. For example, the first opening/closing valve 72a may be opened and the second opening/closing valve 72b may be closed in any one of a case in which the operation pressure value of the compression unit 20 acquired according to a predetermined method (as an example, a pressure value or the like acquired from the first pressure detecting unit 74a) is higher than the threshold value and a case in which the second setting temperature is higher than the threshold temperature of the first refrigerant. Meanwhile, the first opening/closing valve 72a may be closed and the second opening/closing valve 72b may be opened in any one of a case in which the operation pressure value of the compression unit 20 is lower than the threshold value and a case in which the second setting temperature is lower than the threshold temperature of the first refrigerant. Accordingly, the open-close control of the first opening/closing valve 72a and the second opening/closing valve 72b can be performed on the basis of the second setting temperature and the operation pressure value of the compression unit 20 and the temperature in the storing unit 30 is easily maintained at the threshold temperature (or a superheated steam temperature) or more of the first refrigerant by the heat of the first refrigerant flowing to the storing unit 30 while suppressing an excessive increase in pressure in the first circulation passage 61 as compared with a case in which the opening/closing control of the first opening/closing valve 72a and the second opening/closing valve 72b is performed on the basis of only the second setting temperature.

One embodiment of the present invention provides a refrigerant control system for controlling a refrigerant flowing through a circulation passage connected to a compression section and circulating the refrigerant so as to exchange heat between a cooling target and the refrigerant compressed by the compression section, comprising: a storing section which stores the refrigerant; a first pipe which is connected to an outlet side pipe constituting the circulation passage and located on the side of an outlet of the compression section and flows the refrigerant in the outlet side pipe to the storing section through the first pipe; a second pipe which is connected to an inlet side pipe constituting the circulation passage and located on the side of an inlet of the compression section and flows the refrigerant in the storing section to the inlet side pipe through the second pipe; a first opening/closing valve which is provided in the first pipe and is capable of switching whether to flow the refrigerant in the outlet side pipe to the storing section; a second opening/closing valve which is provided in the second pipe and is capable of switching whether to flow the refrigerant in the storing section to the inlet side pipe; and an opening/closing control section which controls an opening/closing state of the first opening/closing valve and the second opening/closing valve on the basis of a setting temperature of the cooling target set according to a predetermined method.

According to this embodiment, since there are provided a first pipe which is connected to an outlet side pipe and flows the refrigerant in the outlet side pipe to the storing section through the first pipe, and a second pipe which is connected to an inlet side pipe and flows the refrigerant in the storing section to the inlet side pipe through the second pipe, it is easy to maintain the temperature in the storing section at the threshold temperature (or a superheated steam temperature) or more of the refrigerant by the heat of the refrigerant flowing to the storing section while suppressing an excessive increase in pressure in the circulation passage. Accordingly, it is possible to suppress a decrease in amount of the refrigerant in the circulation passage when the refrigerant is condensed in the storing section. Particularly, since the first pipe is connected to the outlet side pipe, it is possible to store the refrigerant in a high compression state and a high density state as compared with a case in which the first pipe is connected to the inlet side pipe. As a result, it is possible to prevent an excessive increase in pressure in the circulation passage or an excessive increase in cooling capacity when the setting temperature of the cooling target is high. Further, since the refrigerant in the storing section can flow into the inlet side pipe and the temperature in the inlet side pipe can be increased by the heat of the flowing refrigerant, it is possible to suppress the deterioration of the function or failure of the compression section due to the saturated steam flowing to the compression section. Further, since there are provided a first opening/closing valve which is capable of switching whether to flow the refrigerant in the outlet side pipe to the storing section, a second opening/closing valve which is capable of switching whether to flow the refrigerant in the storing section to the inlet side pipe, and an opening/closing control section which controls an opening/closing state of the first opening/closing valve and the second opening/closing valve on the basis of a setting temperature of the cooling target set according to a predetermined method, it is possible to effectively perform the inflow and the outflow of the refrigerant in the storing section by the opening/closing control of the first opening/closing valve and the second opening/closing valve based on the setting temperature of the cooling target. From the above features, since it is easy to maintain the function of the compression section, the function of the storing section, and the function of the circulation passage as compared with the related art (a technique of simply flowing the refrigerant in the low source refrigeration cycle to the expansion tank), it is possible to maintain the usability of the refrigerant control system (or the cooling system).

Another embodiment of the present invention provides the refrigerant control system according to the above embodiment, wherein the opening/closing control section opens the first opening/closing valve and closes the second opening/closing valve when the setting temperature of the cooling target is higher than a threshold temperature of the refrigerant and closes the first opening/closing valve and opens the second opening/closing valve when the setting temperature of the cooling target is lower than the threshold temperature of the refrigerant.

According to this embodiment, since the opening/closing control section opens the first opening/closing valve and closes the second opening/closing valve when the setting temperature of the cooling target is higher than the threshold temperature of the refrigerant and closes the first opening/closing valve and opens the second opening/closing valve when the setting temperature of the cooling target is lower than the threshold temperature of the refrigerant, the refrigerant which is in a high compression state and a high density state can flow from the outlet side pipe to the storing section when the setting temperature of the cooling target is higher than the threshold temperature of the refrigerant. Accordingly, it is possible to more effectively prevent an excessive increase in pressure in the circulation passage or an excessive increase in cooling capacity when the setting temperature of the cooling target is high. Further, when the setting temperature of the cooling target is lower than the threshold temperature of the refrigerant, the refrigerant in the storing section can flow into the inlet side pipe and the refrigerant amount of the circulation passage can be increased by that amount. As a result, it is possible to recover the pressure in the circulation passage decreasing with a decrease in the setting temperature of the cooling target and to easily maintain the function of the circulation passage.

Another embodiment of the present invention provides the refrigerant control system according to the above embodiment, wherein the opening/closing control section opens the first opening/closing valve and closes the second opening/closing valve in any one of a case in which an operation pressure value of the compression section acquired according to a predetermined method is larger than the threshold value or a case in which the setting temperature of the cooling target is higher than the threshold temperature of the refrigerant and closes the first opening/closing valve and opens the second opening/closing valve in any one of a case in which the operation pressure value of the compression section is smaller than the threshold value or a case in which the setting temperature of the cooling target is lower than the threshold temperature of the refrigerant.

According to this embodiment, since the opening/closing control section opens the first opening/closing valve and closes the second opening/closing valve in any one of a case in which the operation pressure value of the compression section is higher than the threshold value and a case in which the setting temperature of the cooling target is higher than the threshold temperature of the refrigerant and closes the first opening/closing valve and opens the second opening/closing valve in any one of a case in which the operation pressure value of the compression section is lower than the threshold value and a case in which the setting temperature of the cooling target is lower than the threshold temperature of the refrigerant, the open-close control of the first opening/closing valve and the second opening/closing valve can be performed on the basis of the setting temperature of the cooling target and the operation pressure value of the compression section. Accordingly, the temperature in the storing section is easily maintained at the threshold temperature (or a superheated steam temperature) or more of the refrigerant by the heat of the refrigerant flowing to the storing section while suppressing an excessive increase in pressure in the circulation passage as compared with a case in which the opening/closing control of the first opening/closing valve and the second opening/closing valve is performed on the basis of only the setting temperature of the cooling target.

Another embodiment of the present invention provides the refrigerant control system according to the above embodiment, further comprising: a temperature adjusting section which adjusts a temperature of the refrigerant in the storing section.

According to this embodiment, since there are provided a temperature adjusting section which adjusts a temperature of the refrigerant in the storing section, it is possible to adjust the temperature of the refrigerant in the storing section, and therefore, for example, it is possible to suppress a decrease in amount of the refrigerant in the circulation passage when the refrigerant in the storing section is condensed.

Another embodiment of the present invention provides the refrigerant control system according to the above embodiment, wherein the refrigerant is carbon dioxide.

According to this embodiment, since the refrigerant is carbon dioxide, it is possible to prevent an excessive increase in pressure in the circulation passage even when the refrigerant easily expands as compared with a Freon gas.

Another embodiment of the present invention provides the refrigerant control system according to the above embodiment, wherein the cooling target is a cooling refrigerant of a semiconductor fabrication system.

According to this embodiment, since the cooling target is the cooling refrigerant of the semiconductor fabrication system, it is possible to prevent an excessive increase in pressure of the circulation passage even when the temperature range of the cooling target is relatively wide and to prevent a decrease in flow rate of the refrigerant in the circulation passage when the refrigerant is condensed in the storing section.

Another embodiment of the present invention provides a cooling system for cooling the cooling target using the refrigerant, comprising: a compression section which compresses the refrigerant; a circulation passage which is connected to the compression section, includes a cooling target side pipe located on the side of the cooling target, and circulates the refrigerant so as to exchange heat between the cooling target and the refrigerant compressed by the compression section; the refrigerant control system according to any one of notes 1 to 6; and a heat exchanging section which is provided in the cooling target side pipe and exchanges heat between the cooling target and the refrigerant in the cooling target side pipe.

According to this embodiment, since there are provided a first pipe which is connected to an outlet side pipe and flows the refrigerant in the outlet side pipe to the storing section through the first pipe, and a second pipe which is connected to an inlet side pipe and flows the refrigerant in the storing section to the inlet side pipe through the second pipe, it is easy to maintain the temperature in the storing section at the threshold temperature (or a superheated steam temperature) or more of the refrigerant by the heat of the refrigerant flowing to the storing section while suppressing an excessive increase in pressure in the circulation passage. Accordingly, it is possible to suppress a decrease in amount of the refrigerant in the circulation passage when the refrigerant is condensed in the storing section. Particularly, since the first pipe is connected to the outlet side pipe, it is possible to store the refrigerant in a high compression state and a high density state as compared with a case in which the first pipe is connected to the inlet side pipe. As a result, it is possible to prevent an excessive increase in pressure in the circulation passage or an excessive increase in cooling capacity when the setting temperature of the cooling target is high. Further, since the refrigerant in the storing section can flow into the inlet side pipe and the temperature in the inlet side pipe can be increased by the heat of the flowing refrigerant, it is possible to suppress the deterioration of the function or failure of the compression section due to the saturated steam flowing to the compression section. Further, since there are provided a first opening/closing valve which is capable of switching whether to flow the refrigerant in the outlet side pipe to the storing section, a second opening/closing valve which is capable of switching whether to flow the refrigerant in the storing section to the inlet side pipe, and an opening/closing control section which controls an opening/closing state of the first opening/closing valve and the second opening/closing valve on the basis of a setting temperature of the cooling target set according to a predetermined method, it is possible to effectively perform the inflow and the outflow of the refrigerant in the storing section by the opening/closing control of the first opening/closing valve and the second opening/closing valve based on the setting temperature of the cooling target. From the above features, since it is easy to maintain the function of the compression section, the function of the storing section, and the function of the circulation passage as compared with the related art (a technique of simply flowing the refrigerant in the low source refrigeration cycle to the expansion tank), it is possible to maintain the usability of the refrigerant control system (or the cooling system).

Another embodiment of the present invention provides the cooling system according to the above embodiment, wherein the heat exchanging section includes a first heat exchanging section which is capable of cooling the cooling target and a second heat exchanging section which is capable of heating the cooling target cooled by the first heat exchanging section, wherein the cooling target side pipe includes a first cooling target side pipe which is located on the side of the first heat exchanging section and a second cooling target side pipe which is located on the side of the second heat exchanging section, wherein the cooling system further comprises: a detecting section which detects a temperature in the outlet side pipe or a temperature in the inlet side pipe; a third pipe which is connected to the inlet side pipe and an upstream portion in relation to the first heat exchanging section in the first cooling target side pipe; and a third opening/closing valve which is provided in the third pipe and is capable of adjusting an amount of the refrigerant existing in the cooling target side pipe and flowing to the inlet side pipe, and wherein the opening/closing control section controls an opening degree of the third opening/closing valve on the basis of a detection result of the detecting section.

According to this embodiment, since the heat exchanging section includes a first heat exchanging section which is capable of cooling the cooling target and a second heat exchanging section which is capable of heating the cooling target cooled by the first heat exchanging section, wherein the cooling target side pipe includes a first cooling target side pipe which is located on the side of the first heat exchanging section and a second cooling target side pipe which is located on the side of the second heat exchanging section, wherein the cooling system further comprises: a third pipe which is connected to the inlet side pipe and an upstream portion in relation to the first heat exchanging section in the first cooling target side pipe; and a third opening/closing valve which is capable of adjusting an amount of the refrigerant existing in the cooling target side pipe and flowing to the inlet side pipe, and wherein the opening/closing control section controls an opening degree of the third opening/closing valve on the basis of a detection result of the detecting section, it is possible to adjust the opening degree of the third opening/closing valve on the basis of the temperature of the refrigerant and to efficiently adjust the temperature of the refrigerant in the outlet side pipe.

Another embodiment of the present invention provides the cooling system according to the above embodiment, further comprising: a fourth opening/closing valve which is provided in an upstream portion in relation to the first heat exchanging section in the first cooling target side pipe and is capable of adjusting an amount of the refrigerant existing in the first cooling target side pipe and flowing to the first heat exchanging section; and a fifth opening/closing valve which is provided in a downstream portion in relation to the second heat exchanging section in the second cooling target side pipe and is capable of adjusting an amount of the refrigerant subjected to the heat exchange by the second heat exchanging section and flowing to the inlet side pipe, wherein the opening/closing control section controls an opening degree of the fourth opening/closing valve and the fifth opening/closing valve on the basis of a temperature of the cooling target acquired according to a predetermined method.

According to this embodiment, since the cooling system according comprising: a fourth opening/closing valve which is capable of adjusting an amount of the refrigerant existing in the first cooling target side pipe and flowing to the first heat exchanging section; and a fifth opening/closing valve which is capable of adjusting an amount of the refrigerant subjected to the heat exchange by the second heat exchanging section and flowing to the inlet side pipe, wherein the opening/closing control section controls an opening degree of the fourth opening/closing valve and the fifth opening/closing valve on the basis of a temperature of the cooling target acquired according to a predetermined method, it is possible to adjust the temperature of the refrigerant in the cooling target side pipe so that the temperature of the refrigerant becomes the setting temperature and to efficiently cool the refrigerant.

Another embodiment of the present invention provides the cooling system according to the above embodiment, further comprising: a refrigerant heat exchanging section which exchanges heat between the refrigerant in an upstream portion in relation to the first heat exchanging section in the first cooling target side pipe and the refrigerant in a downstream portion in relation to the second heat exchanging section in the second cooling target side pipe.

According to this embodiment, since the cooling system according further comprising: a refrigerant heat exchanging section which exchanges heat between the refrigerant in an upstream portion in relation to the first heat exchanging section in the first cooling target side pipe and the refrigerant in a downstream portion in relation to the second heat exchanging section in the second cooling target side pipe, the temperature of the refrigerant in a downstream portion in relation to the second heat exchanging section in the second cooling target side pipe can be increased and the dried refrigerant can flow into the compression section.

Another embodiment of the present invention provides the cooling system according to the above embodiment, further comprising: a compression control section which controls the compression section on the basis of the detection result of the detecting section and the temperature of the cooling target acquired according to a predetermined method.

According to this embodiment, the cooling system further comprising: a compression control section which controls the compression section on the basis of the detection result of the detecting section and the temperature of the cooling target acquired according to a predetermined method, it is possible to control the compression section on the basis of the temperature of the refrigerant and the temperature of the cooling target and to efficiently control the compression section.

REFERENCE SIGNS LIST

1 Cooling system
10 First cooling system
20 Compression unit
21 Compression unit body
22 First outlet
23 First inlet
24 Second outlet
25 Second inlet
30 Storing unit
41 First heat exchanging unit
42 Second heat exchanging unit
43 Third heat exchanging unit
44 Fourth heat exchanging unit
45 Firth heat exchanging unit
46 Sixth heat exchanging unit
47 Removal unit
50 Circulation unit
60 First circulation unit
61 First circulation passage
62 Compression unit side pipe
62$a$ Outlet side pipe
62$b$ inlet side pipe
63 Cooling target side pipe
63$a$ First cooling target side pipe
63$b$ Second cooling target side pipe
71$a$ First sub-pipe
71$b$ Second sub-pipe
71$c$ Third sub-pipe
71$d$ Fourth sub-pipe
72$a$ First opening/closing valve
72$b$ Second opening/closing valve
72$c$ Third opening/closing valve
72$d$ Fourth opening/closing valve
72$e$ Fifth opening/closing valve
72$f$ Sixth opening/closing valve
73$a$ First temperature detecting unit
73$b$ Second temperature detecting unit
73$c$ Third temperature detecting unit
74$a$ First pressure detecting unit
74$b$ Second pressure detecting unit
74$c$ Third pressure detecting unit
80 Second circulation unit
81 Second circulation passage
82 Temperature detecting unit
83 Pressure detecting unit
100 Second cooling system
110 Air vent portion
120 Storing unit
130 Delivery unit
131 Delivery passage
132$a$ First sub-delivery pipe
132$b$ Second sub-delivery pipe
132$c$ Third sub-delivery pipe
132$d$ Fourth sub-delivery pipe
133$a$ First delivery opening/closing valve
133$b$ Second delivery opening/closing valve
133$c$ Third delivery opening/closing valve
133$d$ Fourth delivery opening/closing valve
134 Pump unit 135a First delivery temperature detecting unit
135b Second delivery temperature detecting unit
136 Delivery pressure detecting unit
137 Flow rate detecting unit
200 Third cooling system
201 First delivery passage
202 Second delivery passage
203 First delivery opening/closing valve
204 Second delivery opening/closing valve
205 Delivery temperature detecting unit
300 Control device
310 Operation unit
320 Communication unit
330 Output unit
340 Power supply unit
350 control unit
351 Opening/closing control unit
332 Compression control unit
360 Storage unit
401 First delivery unit
402 Second delivery unit
410 Temperature adjustment unit

The invention claimed is:

1. A refrigerant control system for controlling a refrigerant flowing through a circulation passage connected to a compression section and circulating the refrigerant so as to exchange heat between a cooling target and the refrigerant compressed by the compression section, comprising:
a storing section which stores the refrigerant;
a first pipe which is connected to an outlet side pipe constituting the circulation passage and located on the side of an outlet of the compression section and flows the refrigerant in the outlet side pipe to the storing section through the first pipe;
a second pipe which is connected to an inlet side pipe constituting the circulation passage and located on the side of an inlet of the compression section and flows the refrigerant in the storing section to the inlet side pipe through the second pipe;
a first opening/closing valve which is provided in the first pipe and is capable of switching whether to flow the refrigerant in the outlet side pipe to the storing section;
a second opening/closing valve which is provided in the second pipe and is capable of switching whether to flow the refrigerant in the storing section to the inlet side pipe; and
an opening/closing control section which controls an opening/closing state of the first opening/closing valve and the second opening/closing valve on the basis of a setting temperature of the cooling target set according to a predetermined method.

2. The refrigerant control system according to claim 1, wherein the opening/closing control section opens the first opening/closing valve and closes the second opening/closing valve when the setting temperature of the cooling target is higher than a threshold temperature of the refrigerant and closes the first opening/closing valve and opens the second opening/closing valve when the setting temperature of the cooling target is lower than the threshold temperature of the refrigerant.

3. The refrigerant control system according to claim 2, wherein the opening/closing control section opens the first opening/closing valve and closes the second opening/closing valve in any one of a case in which an operation pressure value of the compression section acquired according to a predetermined method is larger than the threshold value or a case in which the setting temperature of the cooling target is higher than the threshold temperature of the refrigerant and closes the first opening/closing valve and opens the second opening/closing valve in any one of a case in which the operation pressure value of the compression section is smaller than the threshold value or a case in which the setting temperature of the cooling target is lower than the threshold temperature of the refrigerant.

4. The refrigerant control system according to claim 1, further comprising:
a temperature adjusting section which adjusts a temperature of the refrigerant in the storing section.

5. The refrigerant control system according to claim 1, wherein the refrigerant is carbon dioxide.

6. The refrigerant control system according to claim 1, wherein the cooling target is a cooling refrigerant of a semiconductor fabrication system.

7. A cooling system for cooling the cooling target using the refrigerant, comprising:
a compression section which compresses the refrigerant;
a circulation passage which is connected to the compression section, includes a cooling target side pipe located on the side of the cooling target, and circulates the refrigerant so as to exchange heat between the cooling target and the refrigerant compressed by the compression section;
the refrigerant control system according to claim 1; and
a heat exchanging section which is provided in the cooling target side pipe and exchanges heat between the cooling target and the refrigerant in the cooling target side pipe.

8. The cooling system according to claim 7,
wherein the heat exchanging section includes a first heat exchanging section which is capable of cooling the cooling target and a second heat exchanging section which is capable of heating the cooling target cooled by the first heat exchanging section,
wherein the cooling target side pipe includes a first cooling target side pipe which is located on the side of the first heat exchanging section and a second cooling target side pipe which is located on the side of the second heat exchanging section,
wherein the cooling system further comprises:
a detecting section which detects a temperature in the outlet side pipe or a temperature in the inlet side pipe;
a third pipe which is connected to the inlet side pipe and an upstream portion in relation to the first heat exchanging section in the first cooling target side pipe; and
a third opening/closing valve which is provided in the third pipe and is capable of adjusting an amount of the refrigerant existing in the cooling target side pipe and flowing to the inlet side pipe, and
wherein the opening/closing control section controls an opening degree of the third opening/closing valve on the basis of a detection result of the detecting section.

9. The cooling system according to claim 8, further comprising:
a fourth opening/closing valve which is provided in an upstream portion in relation to the first heat exchanging section in the first cooling target side pipe and is capable of adjusting an amount of the refrigerant existing in the first cooling target side pipe and flowing to the first heat exchanging section; and
a fifth opening/closing valve which is provided in a downstream portion in relation to the second heat exchanging section in the second cooling target side pipe and is capable of adjusting an amount of the refrigerant subjected to the heat exchange by the second heat exchanging section and flowing to the inlet side pipe, wherein the opening/closing control section controls an opening degree of the fourth opening/closing valve and the fifth opening/closing valve on the basis of a temperature of the cooling target acquired according to a predetermined method.

10. The cooling system according to claim 7 further comprising;
a refrigerant heat exchanging section which exchanges heat between the refrigerant in an upstream portion in relation to the first heat exchanging section in the first cooling target side pipe and the refrigerant in a downstream portion in relation to the second heat exchanging section in the second cooling target side pipe.

11. The cooling system according to claim 7, further comprising:
a compression control section which controls the compression section on the basis of the detection result of the detecting section and the temperature of the cooling target acquired according to a predetermined method.

* * * * *